(12) United States Patent
Baek et al.

(10) Patent No.: US 11,665,452 B2
(45) Date of Patent: May 30, 2023

(54) IMAGE SENSOR

(71) Applicant: SAMSUNG ELECTRONICS CO., LTD., Suwon-si (KR)

(72) Inventors: Ingyu Baek, Seoul (KR); Hyunchul Kim, Seoul (KR); Jinyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 572 days.

(21) Appl. No.: 16/743,222

(22) Filed: Jan. 15, 2020

(65) Prior Publication Data

US 2020/0389608 A1 Dec. 10, 2020

(30) Foreign Application Priority Data

Jun. 5, 2019 (KR) .................. 10-2019-0066959

(51) Int. Cl.
*H01L 27/00* (2006.01)
*H04N 25/771* (2023.01)
*H01L 49/02* (2006.01)
*H01L 27/146* (2006.01)
*H04N 25/75* (2023.01)

(52) U.S. Cl.
CPC ....... *H04N 25/771* (2023.01); *H01L 27/1463* (2013.01); *H01L 27/14609* (2013.01); *H01L 27/14636* (2013.01); *H01L 28/60* (2013.01); *H04N 25/75* (2023.01)

(58) Field of Classification Search
CPC ......... H01L 27/14601; H01L 27/14634; H01L 27/14636; H01L 27/14609; H01L 28/60
See application file for complete search history.

(56) References Cited

U.S. PATENT DOCUMENTS

| | | | |
|---|---|---|---|
| 7,847,847 B2 | 12/2010 | Yaung et al. | |
| 9,490,373 B2 | 11/2016 | Sakano et al. | |
| 10,116,891 B2 | 10/2018 | Raynor | |
| 10,186,535 B2 | 1/2019 | Hynecek et al. | |

(Continued)

FOREIGN PATENT DOCUMENTS

| | | |
|---|---|---|
| JP | 4006207 B2 | 11/2007 |
| JP | 2008-85029 A | 4/2008 |
| WO | 2017/169480 A1 | 10/2017 |

*Primary Examiner* — Reema Patel
(74) *Attorney, Agent, or Firm* — Sughrue Mion, PLLC

(57) ABSTRACT

An image sensor is provided and includes a photoelectric conversion layer, an integrated circuit layer, and a charge storage layer. The photoelectric conversion layer includes a pixel separation structure defining pixel regions, each including a photoelectric conversion region. The integrated circuit layer read charges from the photoelectric conversion regions. The charge storage layer includes a stacked capacitor for each of the pixel regions. The stacked capacitor includes a lower pad electrode, an intermediate pad electrode, an upper pad electrode, a contact plug connecting the upper pad electrode to the lower pad electrode, a first lower capacitor structure connected between the lower pad electrode and the intermediate pad electrode, and an upper capacitor structure connected between the intermediate pad electrode and the upper pad electrode. The upper capacitor structure is stacked on the lower capacitor structure to partially overlap the lower capacitor structure when viewed in plan view.

17 Claims, 21 Drawing Sheets

(56) References Cited

U.S. PATENT DOCUMENTS

| | | |
|---|---|---|
| 2009/0128991 A1 | 5/2009 | Mauritzson |
| 2009/0201400 A1 | 8/2009 | Zhang et al. |
| 2018/0247968 A1 | 8/2018 | Na et al. |
| 2018/0366508 A1 | 12/2018 | Goto et al. |
| 2019/0081100 A1 | 3/2019 | Matsumoto et al. |
| 2019/0267423 A1* | 8/2019 | Lee .................. H01L 27/14689 |

* cited by examiner

IMAGE SENSOR

CROSS-REFERENCE TO RELATED APPLICATION

This application claims priority under 35 U.S.C. § 119 to Korean Patent Application No. 10-2019-0066959, filed on Jun. 5, 2019, in the Korean Intellectual Property Office, the disclosure of which is hereby incorporated by reference in its entirety.

BACKGROUND

1. Field

Embodiments of the present disclosure relate to an image sensor, and more particularly, to an image sensor capable of performing a global shutter operation.

2. Description of Related Art

An image sensor may be an electronic device for converting an optical image into an electrical signal. As computer and communication industries have been developed, high-performance image sensors have been increasingly demanded for incorporation into various devices such as a digital camera, a camcorder, a personal communication system (PCS), a game console, a security camera, and a medical micro camera. In addition, image sensors for realizing three-dimensional (3D) images as well as color images have been developed.

SUMMARY

One or more example embodiments provide an image sensor with improved shutter efficiency.

According to an aspect of an embodiment, there is provided an image sensor comprising a photoelectric conversion layer including a pixel separation structure defining a plurality of pixel regions, each pixel region including a photoelectric conversion region; an integrated circuit layer disposed on the photoelectric conversion layer and comprising readout circuits to read charges from the photoelectric conversion region of the pixel regions; a charge storage layer disposed on the integrated circuit layer and comprising a stacked capacitor for each of the plurality of pixel regions, the stacked capacitor comprising a first lower pad electrode; an intermediate pad electrode; a first upper pad electrode; a contact plug connecting the first upper pad electrode to the first lower pad electrode; a first lower capacitor structure connected between the first lower pad electrode and the intermediate pad electrode and comprising a plurality of first lower storage electrodes for storing the charges read from the photoelectric conversion region of the pixel region; and an upper capacitor structure connected between the intermediate pad electrode and the first upper pad electrode and comprising a plurality of upper storage electrodes for storing the charges read from the photoelectric conversion region of the pixel region, the upper capacitor structure being stacked on the first lower capacitor structure to partially overlap the first lower capacitor structure when viewed in plan view.

According to another aspect of an embodiment, there is provided an image sensor comprising a photoelectric conversion layer having a pixel separation structure defining a photoelectric conversion region; an integrated circuit layer disposed on the photoelectric conversion layer and comprising readout circuits to read charges from the photoelectric conversion region; a first charge storage layer comprising a first capacitor structure comprising a plurality of first storage electrodes for storing the charges read from the photoelectric conversion region; and a first warpage control layer; and a second charge storage layer bonded to the first charge storage layer, the second charge storage layer comprising a second capacitor structure comprising a plurality of second storage electrodes for storing the charges read from the photoelectric conversion region, the second capacitor structure being stacked on the first capacitor structure to partially overlap the first capacitor structure when viewed in plan view; and a second warpage control layer formed on a surface of the second charge storage layer facing the first charge storage layer.

According to another aspect of an embodiment, there is provided an image sensor comprising a pixel array including a plurality of pixels, each pixel comprising a stacked capacitor comprising a lower pad electrode; a first intermediate pad electrode; a second intermediate pad electrode; an upper pad electrode; a lower capacitor structure connected between the lower pad electrode and the first intermediate pad electrode; an intermediate capacitor structure connected between the first intermediate pad electrode and the second intermediate pad electrode, the intermediate capacitor structure being stacked on the lower capacitor structure to partially overlap the lower capacitor structure when viewed in plan view; a lower contact plug connecting the second intermediate pad electrode to the lower pad electrode; an upper capacitor structure connected between the second intermediate pad electrode and the upper pad electrode, the upper capacitor structure being stacked on the intermediate capacitor structure; and an upper contact plug connecting the second intermediate pad electrode to the upper pad electrode.

BRIEF DESCRIPTION OF THE DRAWINGS

These and other aspects will become more apparent in view of the attached drawings and accompanying detailed description, in which.

DETAILED DESCRIPTION

Image sensors according to embodiments of the inventive concepts will be described hereinafter in detail with reference to the accompanying drawings. In the present specification, where a reference designator of a feature is appended with a letter, the structure of the feature with the reference designator is the same and the structure of the feature with the reference designator without the appended letter, unless specifically indicated otherwise. For example, lower electrode structures 231*a* and lower electrode structures 231*b* have the same structure as lower electrode structures 231, except specifically stated otherwise.

Figure 1:
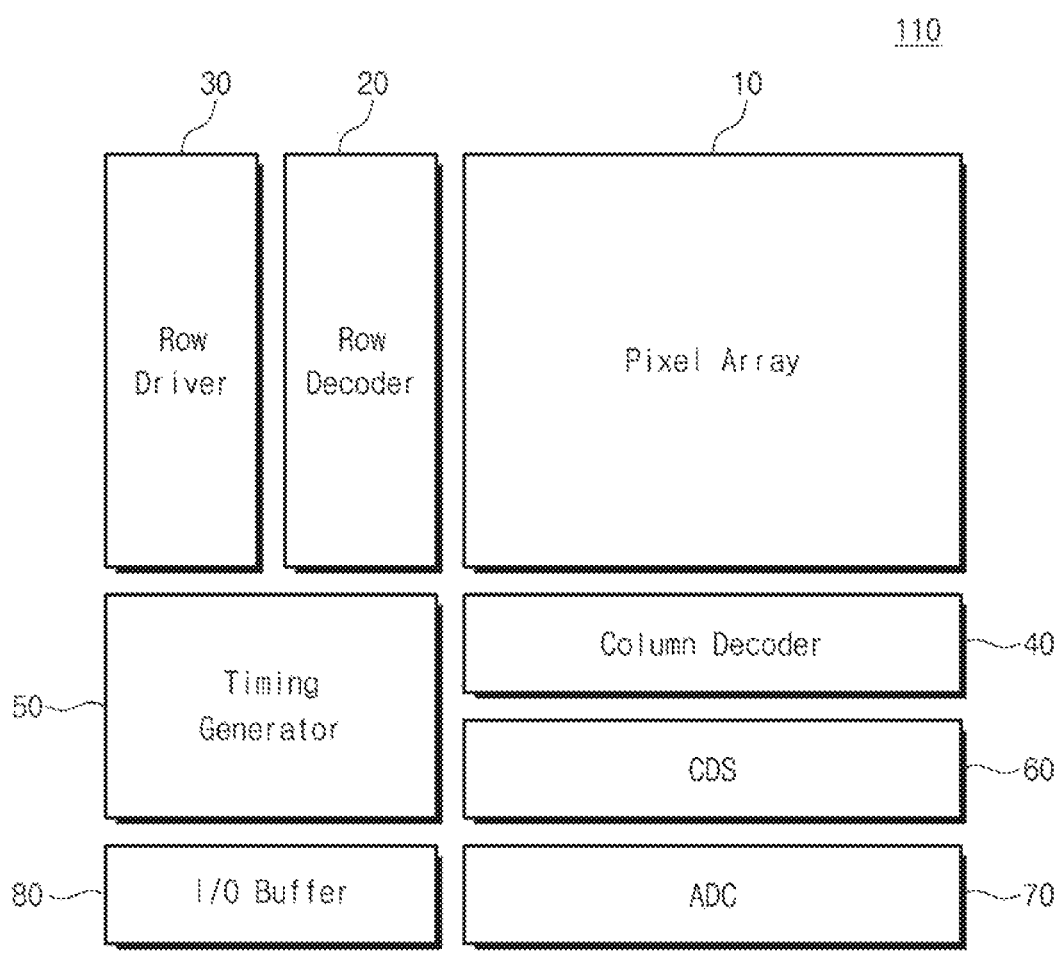
FIG. 1 is a schematic block diagram illustrating an image sensor according to some embodiments.

FIG. 1 is a schematic block diagram illustrating an image sensor according to some embodiments.

Referring to FIG. 1, an image sensor 110 may include a pixel array 10, a row decoder 20, a row driver 30, a column decoder 40, a timing generator 50, a correlated double sampler (CDS) 60, an analog-to-digital converter (ADC) 70, and an input/output (I/O) buffer 80.

The pixel array 10 may include a plurality of unit pixels arranged along rows and columns and may convert light incident on the unit pixels into electrical signals. The row decoder 20 may provide driving signals to the unit pixels in the unit of row. The electrical signals converted in the pixel array 10 may be provided to the correlated double sampler 60 in response to the driving signals. The row driver 30 may provide the driving signals for driving the unit pixels to the pixel array 10 in response to results decoded in the row decoder 20. In the event that the unit pixels are arranged in a matrix form, the driving signals may be provided in the unit of row.

The timing generator 50 may control the row and column decoders 20 and 40, the correlated double sampler 60, the analog-to-digital converter 70, and the I/O buffer 80 and may supply control signals (e.g., clock signals and a timing control signal) thereto in operation thereof. The timing generator 50 may include a logic control circuit, a phase lock loop (PLL) circuit, a timing control circuit, and a communication interface circuit.

The correlated double sampler 60 may receive the electrical signals generated from the pixel array 10 and may hold and sample the received electrical signals. The correlated double sampler 60 may sample a specific noise level and a signal level of the electrical signal and may output a difference level corresponding to a difference between the noise level and the signal level.

The analog-to-digital converter 70 may convert an analog signal, which corresponds to the difference level outputted from the correlated double sampler 60, into a digital signal. The analog-to-digital converter 70 may output the digital signal. The I/O buffer 80 may latch the digital signals outputted from the analog-to-digital converter 70 and may sequentially output the latched digital signals to an image signal processing part (not shown) in response to results decoded in the column decoder 40.

Figure 2:
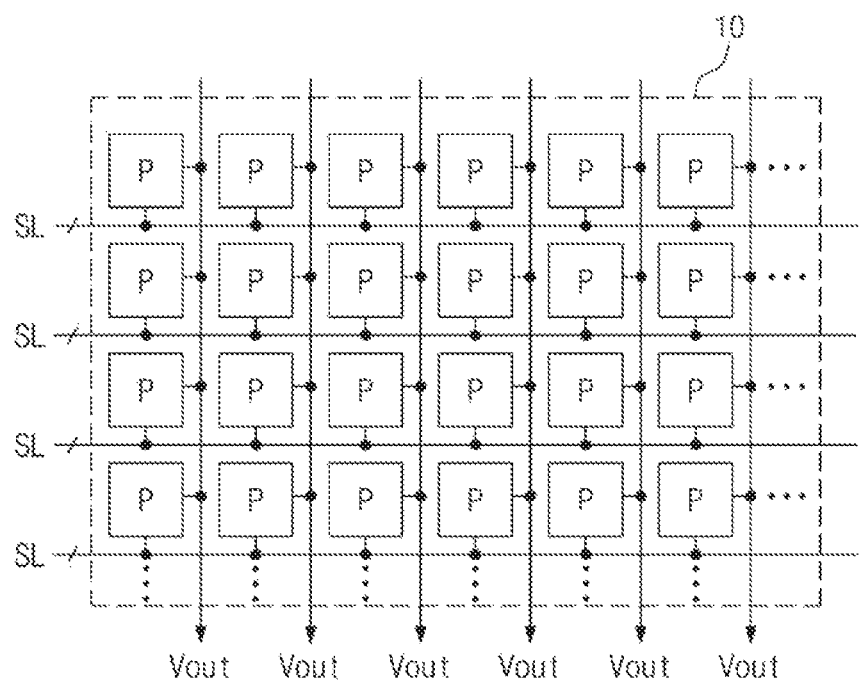
FIG. 2 is a schematic diagram illustrating a pixel array of an image sensor according to some embodiments.

FIG. 2 is a schematic diagram illustrating a pixel array of an image sensor according to some embodiments.

Referring to FIG. 2, the pixel array 10 may include a plurality of driving signal lines SL, and output lines Vout, and a plurality of unit pixels P two-dimensionally arranged along a plurality of rows and a plurality of columns.

An electrical signal may be generated by incident light in each of the unit pixels P. The unit pixels P may be driven by driving signals transmitted through the driving signal lines SL connected to the unit pixels P. Each of the driving signal lines SL may extend in a row direction (e.g., a horizontal direction) to drive the unit pixels P included in the same row at the same time.

Each of the unit pixels P may include a photoelectric conversion element, and a plurality of metal oxide semiconductor (MOS) transistors. The plurality of MOS transistors may constitute a readout circuit and a sampling circuit. The photoelectric conversion elements of the unit pixels P may generate photocharges (or charges) in proportion to the amount of light incident from the outside and may store a voltage proportional to the amount of the generated photocharges. In other words, in each of the unit pixels P, the incident light may be converted into the voltage proportional to the amount of the generated photocharges and the voltage may be stored.

Each of the unit pixels P may include the sampling circuit for holding and sampling charges generated from the photoelectric conversion element, and thus the image sensor according to some embodiments may perform a global shutter operation. In other words, in operation of the image sensor, all the unit pixels P may be exposed at the same time to store charges in all the unit pixels P at the same time, and pixel signals may be sequentially outputted in the unit of row. In some embodiments, the unit pixels P may have the same circuit configuration, and this circuit configuration will be described in detail with reference to FIGS. 3A, 3B and 3C.

Figure 3A:
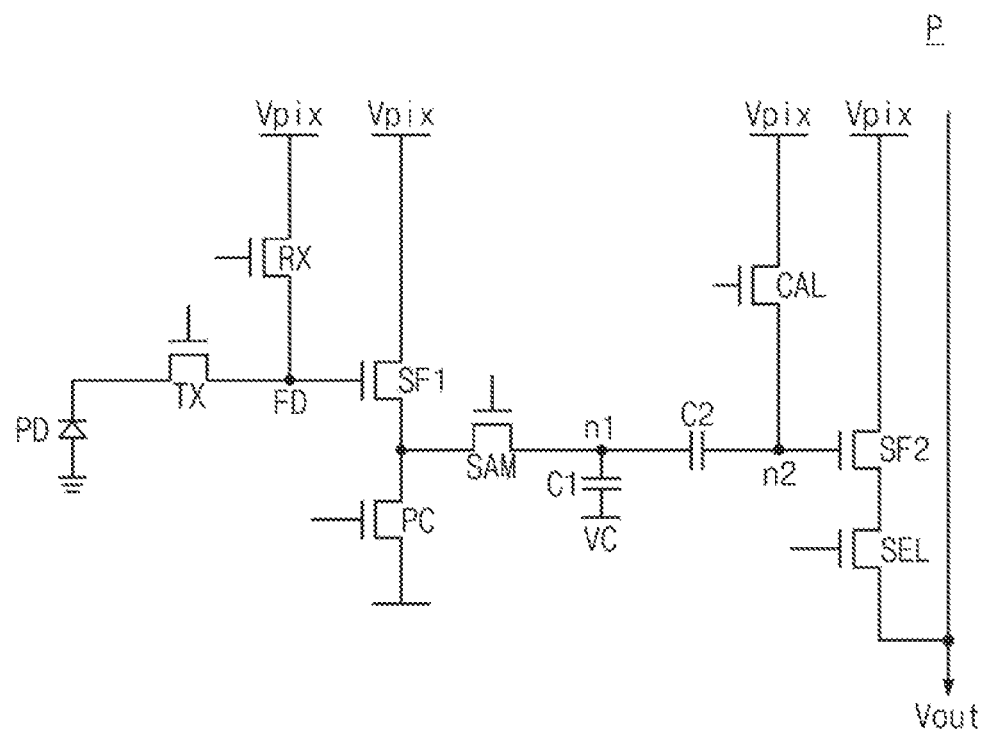
FIGS. 3A, 3B and 3C are circuit diagrams illustrating a unit pixel of a pixel array according to some embodiments.
Figure 3B:
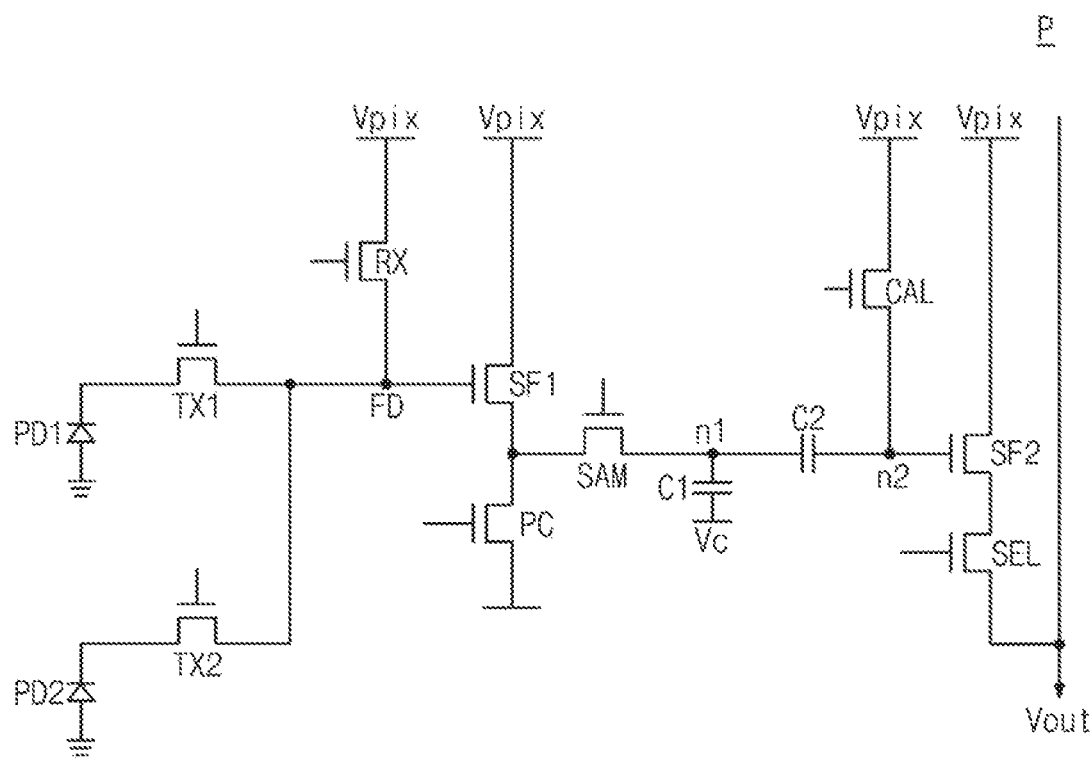
Figure 3C:
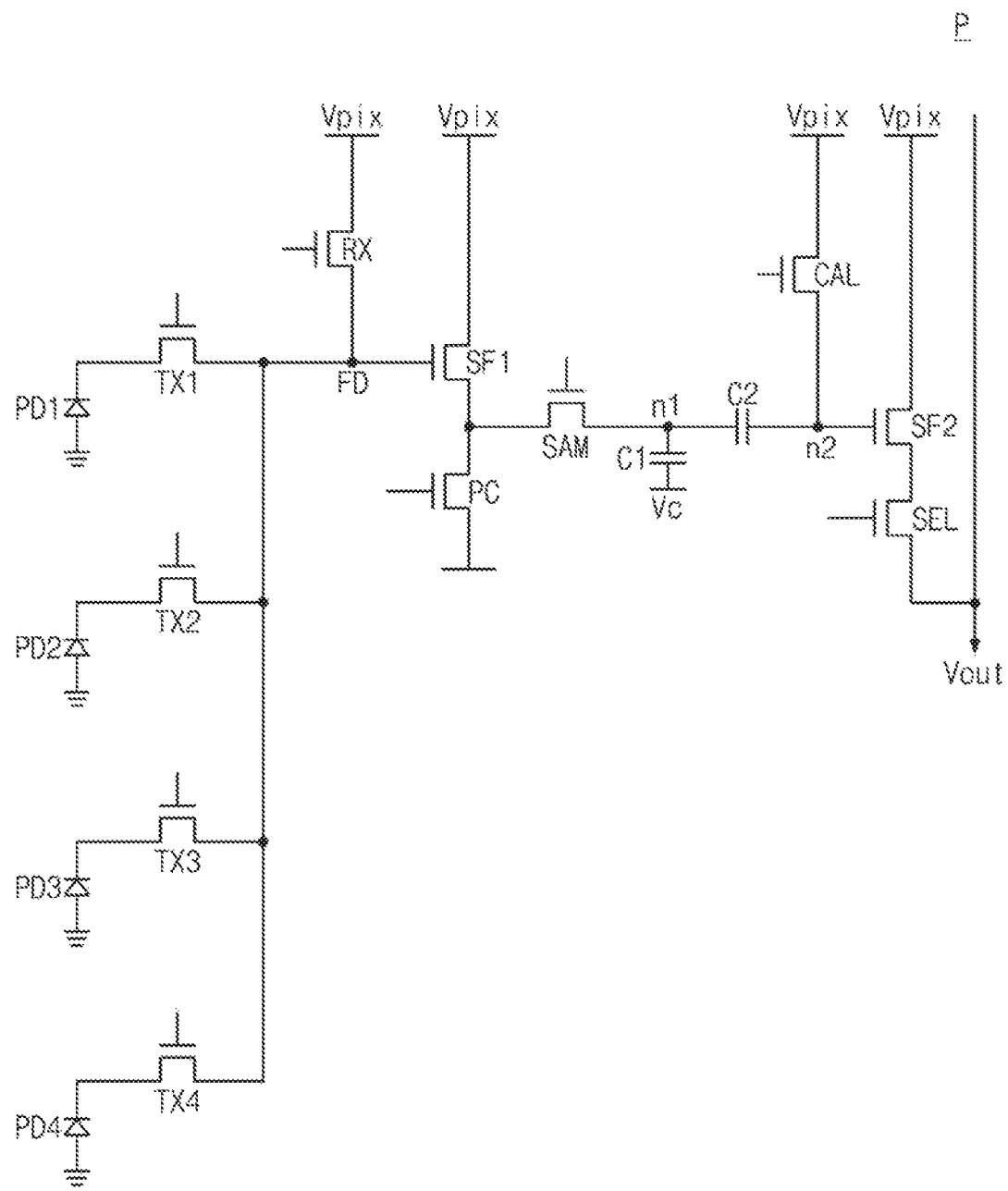

FIGS. 3A, 3B and 3C are circuit diagrams illustrating a unit pixel of a pixel array according to some embodiments.

Referring to FIG. 3A, the image sensor according to some embodiments may have an in-pixel correlated double sampling (CDS) structure.

Each of the unit pixels P may include a photoelectric conversion element PD, a transfer transistor TX, a reset transistor RX, a first source follower transistor SF1, a precharge transistor PC, a sampling transistor SAM, a calibration transistor CAL, a second source follower transistor SF2, a selection transistor SEL, a first capacitor C1, and a second capacitor C2. In some embodiments, the plurality of MOS transistors described above may include the transfer transistor TX, the reset transistor RX, the first source follower transistor SF1, the precharge transistor PC, the sampling transistor SAM, the calibration transistor CAL, the second source follower transistor SF2, and the selection transistor SEL.

The transfer transistor TX may be connected between the photoelectric conversion element PD and a charge detection node (e.g., a floating diffusion region) FD. The transfer transistor TX may transfer charges accumulated in the photoelectric conversion element PD to the charge detection node FD. The transfer transistor TX may be controlled by a charge transfer signal inputted to a transfer gate electrode.

The photoelectric conversion element PD may generate photocharges (or charges) in proportion to the amount of light incident from the outside and may accumulate the generated photocharges. In some embodiments, the photoelectric conversion element PD may include a photodiode, a photo transistor, a photo gate, a pinned photodiode (PPD), or any combination thereof.

The charge detection node FD may receive the charges generated in the photoelectric conversion element PD and may cumulatively store the received charges. A potential of a gate electrode of the first source follower transistor SF1 may be changed depending on the amount of the photocharges accumulated in the charge detection node FD.

The reset transistor RX may periodically reset the charges accumulated in the charge detection node FD. The reset transistor RX may be controlled by a reset signal inputted to its gate electrode. A drain of the reset transistor RX may be connected to the charge detection node FD, and a source of the reset transistor RX may be connected to a power voltage Vpix. When the reset transistor RX is turned-on by the reset signal, the power voltage Vpix connected to the source of the reset transistor RX may be transmitted to the charge detection node FD. In other words, the photocharges accumulated in the charge detection node FD may be discharged to reset the charge detection node FD when the reset transistor RX is turned-on.

The first source follower transistor SF1 may be a source follower buffer amplifier that generates a source-drain current in proportion to the amount of the photocharges provided to a gate electrode thereof. A drain of the first source follower transistor SF1 may be connected to the power voltage Vpix, and a source of the first source follower transistor SF1 may be connected to a source of the precharge transistor PC and a source of the sampling transistor SAM.

The sampling transistor SAM may be connected between the source of the first source follower transistor SF1 and a first node n1. First electrodes of each of the first and second capacitors C1 and C2 may be connected to the first node n1. A capacitor voltage VC may be applied to a second electrode of the first capacitor C1, and a second electrode of the second capacitor C2 may be connected to a second node n2.

A drain of the calibration transistor CAL may be connected to the power voltage Vpix, and a source of the calibration transistor CAL may be connected to the second node n2. The second node n2 may be calibrated by the calibration transistor CAL.

A gate electrode of the second source follower transistor SF2 may be connected to the second node n2. A drain of the second source follower transistor SF2 may be connected to the power voltage Vpix, and a source of the second source follower transistor SF2 may be connected to a drain of the selection transistor SEL. The second source follower transistor SF2 may amplify a potential change in the second node n2 and may output a pixel signal to the output line Vout through the selection transistor SEL.

A method of operating the unit pixel P may include a reset operation of resetting the photoelectric conversion element PD and the charge detection node FD, a light accumulation operation of accumulating photocharges in the photoelectric conversion element PD, and a sampling operation of outputting the accumulated photocharges as a pixel signal. The sampling operation may include a reset signal sampling operation and an image signal sampling operation.

In the reset operation, the reset transistor RX and the transfer transistor TX may be turned-on. Thus, the power voltage Vpix may be provided to the charge detection node FD. As a result, charges in the photoelectric conversion element PD and the charge detection node FD may be discharged to reset the photoelectric conversion element PD and the charge detection node FD.

After resetting the photoelectric conversion element PD and the charge detection node FD, photocharges may be generated and accumulated in the photoelectric conversion element PD until the transfer transistor TX is turned-on again after the transfer transistor TX is turned-off (i.e., for a photoelectric conversion time).

After the light accumulation operation, the charge detection node FD may be reset by the power voltage Vpix. Here, a reset signal may include a noise component. The reset signal including the noise component may be amplified in the first source follower transistor SF1.

In the reset signal sampling operation, the sampling transistor SAM may be turned-on and the first and second capacitors C1 and C2 may sample the reset signal. When the reset signal sampling operation starts, the first and second capacitors C1 and C2 may be precharged to remove their previous sampled voltages such that the first source follower transistor SF1 can sample a new voltage. This precharge operation may be performed using the precharge transistor PC. In the reset signal sampling operation, the calibration transistor CAL may be turned-off. After the reset signal sampling operation, the transfer transistor TX may be turned-on again, and an image signal detected in the charge detection node FD may not include noise.

In the image signal sampling operation, the sampling transistor SAM may be turned-on and the first and second capacitors C1 and C2 may sample the image signal. Here, a voltage of the first capacitor C1 may have a value proportional to the amount of charges transferred by the transfer transistor TX. Thus, the voltage value in the first capacitor C1 may be a new voltage value different from that of the previous reset signal. In the image signal sampling operation, the second node n2 of the second capacitor C2 may be floated, and the amount of charges of the second capacitor C2 may be maintained at the amount of charges in the previous reset signal sampling operation. Here, a voltage of the second node n2 of the second capacitor C2 may drop to a voltage of the first node n1 of the second capacitor C2, not a calibrated voltage (e.g., Vpix).

In the reset signal sampling operation, the second node n2 of the second capacitor C2 may be continuously calibrated by the calibrated voltage (e.g., Vpix) and thus may not include a noise component. Thus, a pixel signal not including a noise component may be transmitted to the analog-to-digital converter.

In the image signal sampling operation, the second capacitor C2 may be charged with a voltage corresponding to a difference between voltages (e.g., the reset signal) charged in the reset signal sampling operation and the image signal generated from the unit pixel P.

A specific noise level and an image signal level by an image may be doubly sampled in each of the unit pixels P, and the pixel signal corresponding to a difference between the noise level and the image signal level may be outputted from each of the unit pixels P. In other words, each of the unit pixels P may generate a voltage which is in proportion to a difference between a potential of the charge detection node FD in the reset state and a potential of the charge detection node FD formed by the photocharges generated by the image signal.

According to an embodiment illustrated in FIG. 3B, a unit pixel P may include first and second photoelectric conversion elements PD1 and PD2 and first and second transfer transistors TX1 and TX2. The first and second transfer transistors TX1 and TX2 may share the charge detection node FD. The first and second transfer transistors TX1 and TX2 may be controlled independently of each other by charge transfer signals. Thus, in some embodiments, the plurality of MOS transistors described above may include the first and second transfer transistors TX1 and TX2, the reset transistor RX, the first source follower transistor SF1, the precharge transistor PC, the sampling transistor SAM, the calibration transistor CAL, the second source follower transistor SF2, and the selection transistor SEL.

According to an embodiment illustrated in FIG. 3C, a unit pixel P may include first, second, third and fourth photoelectric conversion elements PD1, PD2, PD3 and PD4 and first, second, third and fourth transfer transistors TX1, TX2, TX3 and TX4. The first to fourth transfer transistors TX1 to TX4 may share the charge detection node FD. The first to fourth transfer transistors TX1 to TX4 may be controlled independently of each other by charge transfer signals. Thus, in some embodiments, the plurality of MOS transistors described above may include the first to fourth transfer transistors TX1 to TX4, the reset transistor RX, the first source follower transistor SF1, the precharge transistor PC, the sampling transistor SAM, the calibration transistor CAL, the second source follower transistor SF2, and the selection transistor SEL.

Figure 4A:
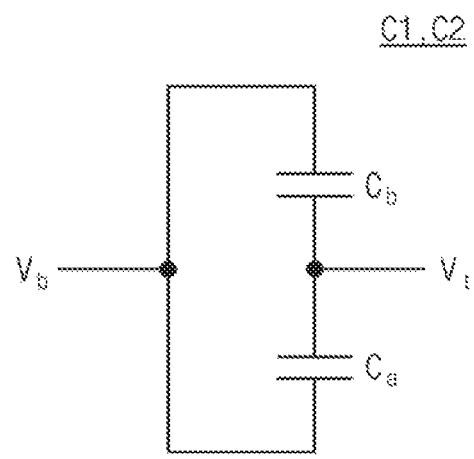
FIGS. 4A, 4B and 4C are circuit diagrams illustrating a capacitor provided in a unit pixel according to some embodiments.
Figure 4B:
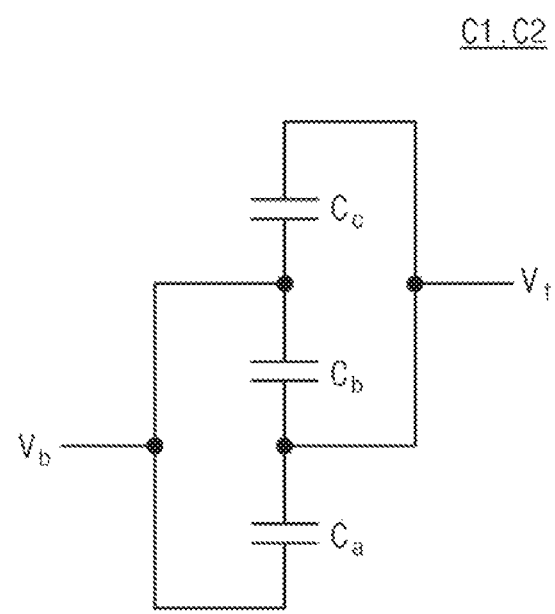
Figure 4C:
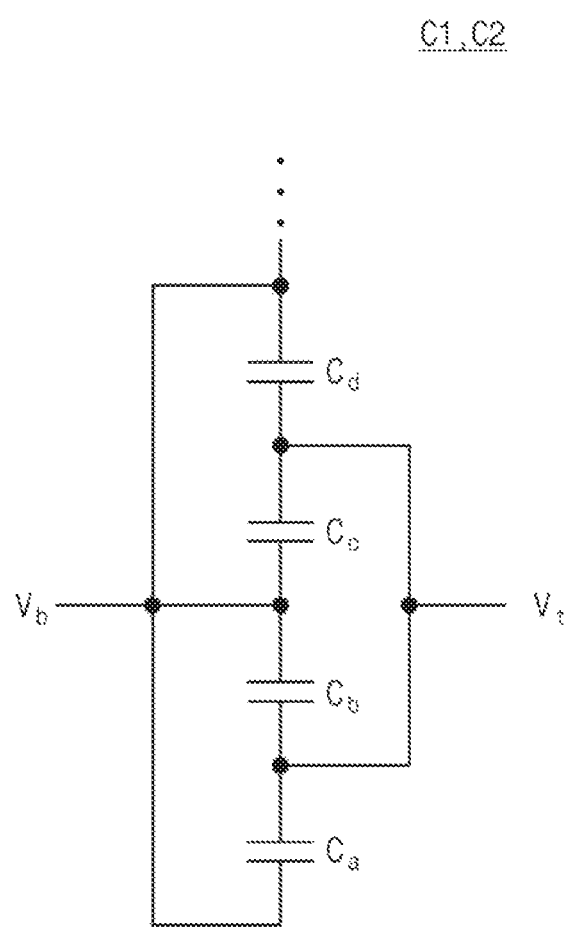

FIGS. 4A, 4B and 4C are circuit diagrams illustrating a capacitor provided in a unit pixel according to some embodiments.

Referring to FIG. 4A, each of the first and second capacitors C1 and C2 may include a first sub-capacitor $C_a$ and a second sub-capacitor $C_b$. Each of the first and second sub-capacitors $C_a$ and $C_b$ may include a first electrode and a second electrode. A bottom voltage $V_b$ may be applied in common to the first electrodes of the first and second sub-capacitors $C_a$ and $C_b$. A top voltage $V_t$ may be applied in common to the second electrodes of the first and second sub-capacitors $C_a$ and $C_b$. In other words, the first and second sub-capacitors $C_a$ and $C_b$ may be connected in parallel to each other, and thus a capacitance of each of the first and second capacitors C1 and C2 may be increased.

Referring to FIG. 4B, each of the first and second capacitors C1 and C2 may include a first sub-capacitor $C_a$, a second sub-capacitor $C_b$, and a third sub-capacitor $C_c$. Each of the first to third sub-capacitors $C_a$, $C_b$ and $C_c$ may include a first electrode and a second electrode. The bottom voltage $V_b$ may be applied in common to the first electrodes of the first to third sub-capacitors $C_a$, $C_b$ and $C_c$, and the top voltage $V_t$ may be applied in common to the second electrodes of the first to third sub-capacitors $C_a$, $C_b$ and $C_c$. In other words, the first to third sub-capacitors $C_a$, $C_b$ and $C_c$ may be connected in parallel to each other, and thus a capacitance of each of the first and second capacitors C1 and C2 may be increased more than that of the configuration shown in FIG. 4A.

Referring to FIG. 4C, each of the first and second capacitors C1 and C2 may include a first sub-capacitor $C_a$, a second sub-capacitor $C_b$, a third sub-capacitor $C_c$, and a fourth sub-capacitor $C_d$. Each of the first, second, third and fourth sub-capacitors $C_a$, $C_b$, $C_c$ and $C_d$ may include a first electrode and a second electrode. The bottom voltage $V_b$ may be applied in common to the first electrodes of the first to fourth sub-capacitors $C_a$, $C_b$, $C_c$ and $C_d$, and the top voltage $V_t$ may be applied in common to the second electrodes of the first to fourth sub-capacitors $C_a$, $C_b$, $C_c$ and $C_d$. In other words, the first to fourth sub-capacitors $C_a$, $C_b$, $C_c$ and $C_d$ may be connected in parallel to each other. Thus, a capacitance of each of the first and second capacitors C1 and C2 may be increased more than that of the configuration shown in FIG. 4B. According to some embodiments, the capacitance of each of the first and second capacitors C1 and C2 may be increased in proportion to the number of the sub-capacitors which constitute each of the first and second capacitors C1 and C2 and are connected in parallel to each other.

Figure 5:
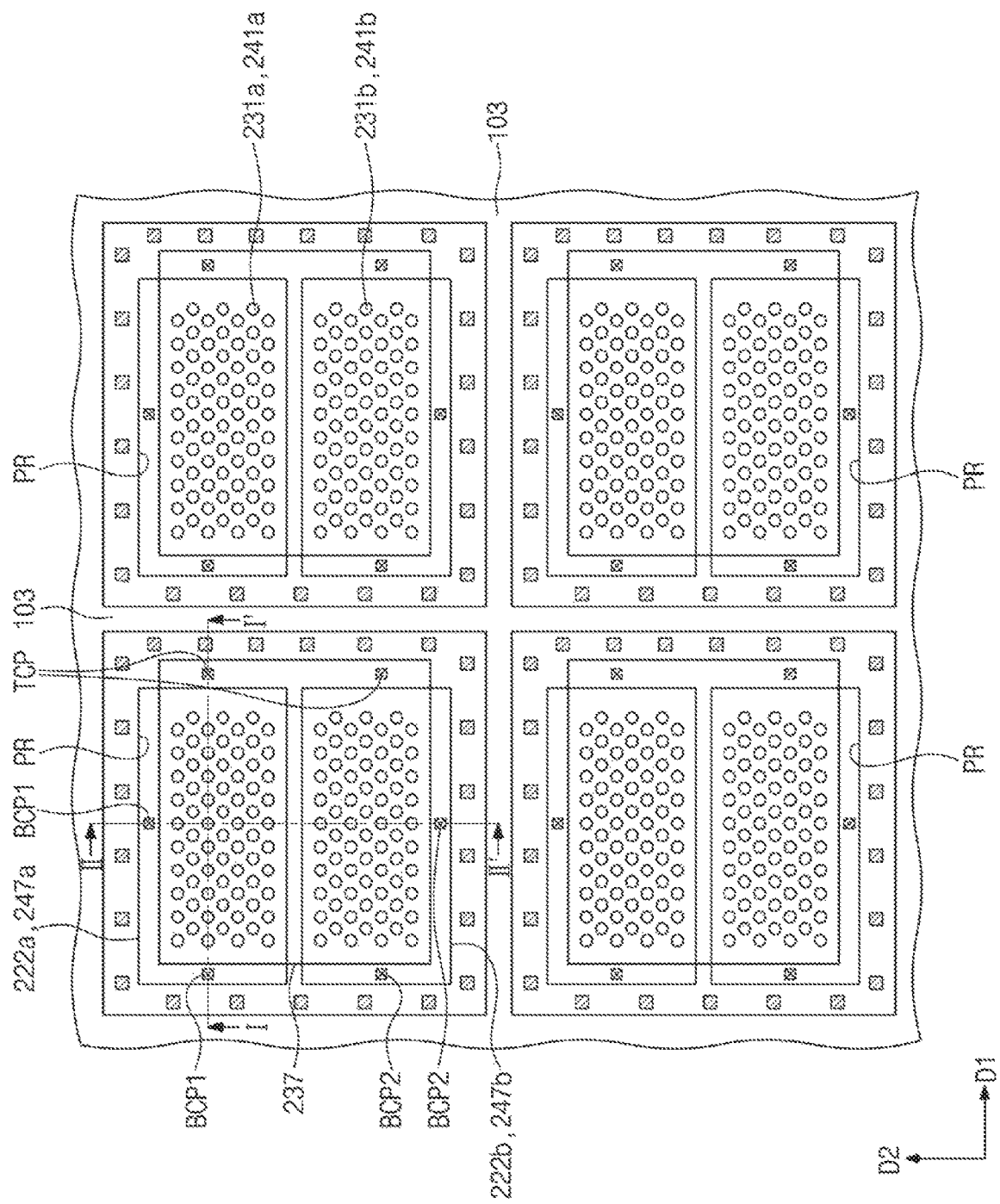
FIG. 5 is a schematic plan view illustrating an image sensor according to some embodiments.
Figure 6A:
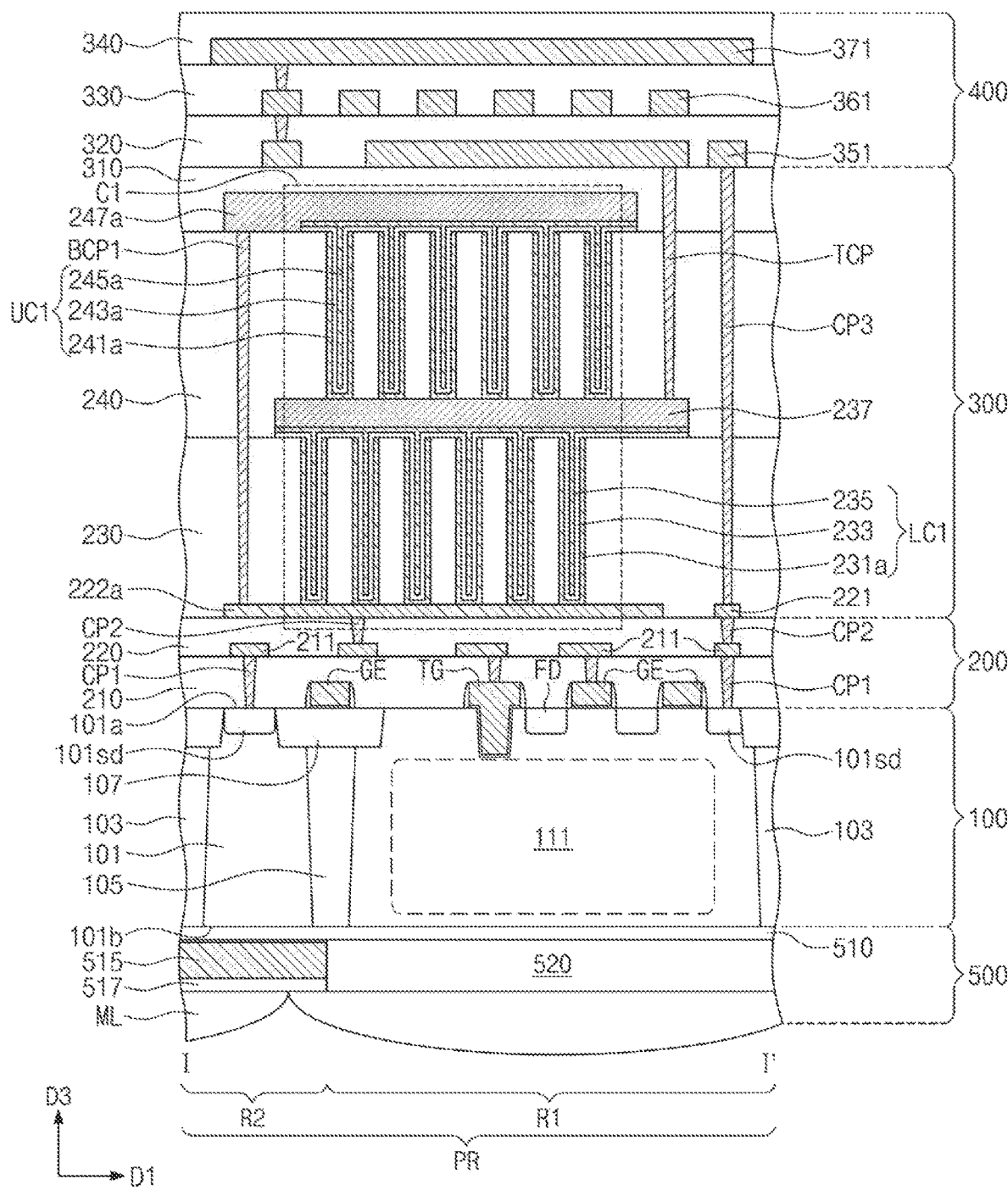
FIGS. 6A and 6B are cross-sectional views taken along lines I-I' and II-IF of FIG. 5, respectively, to illustrate an image sensor according to some embodiments.
Figure 6B:
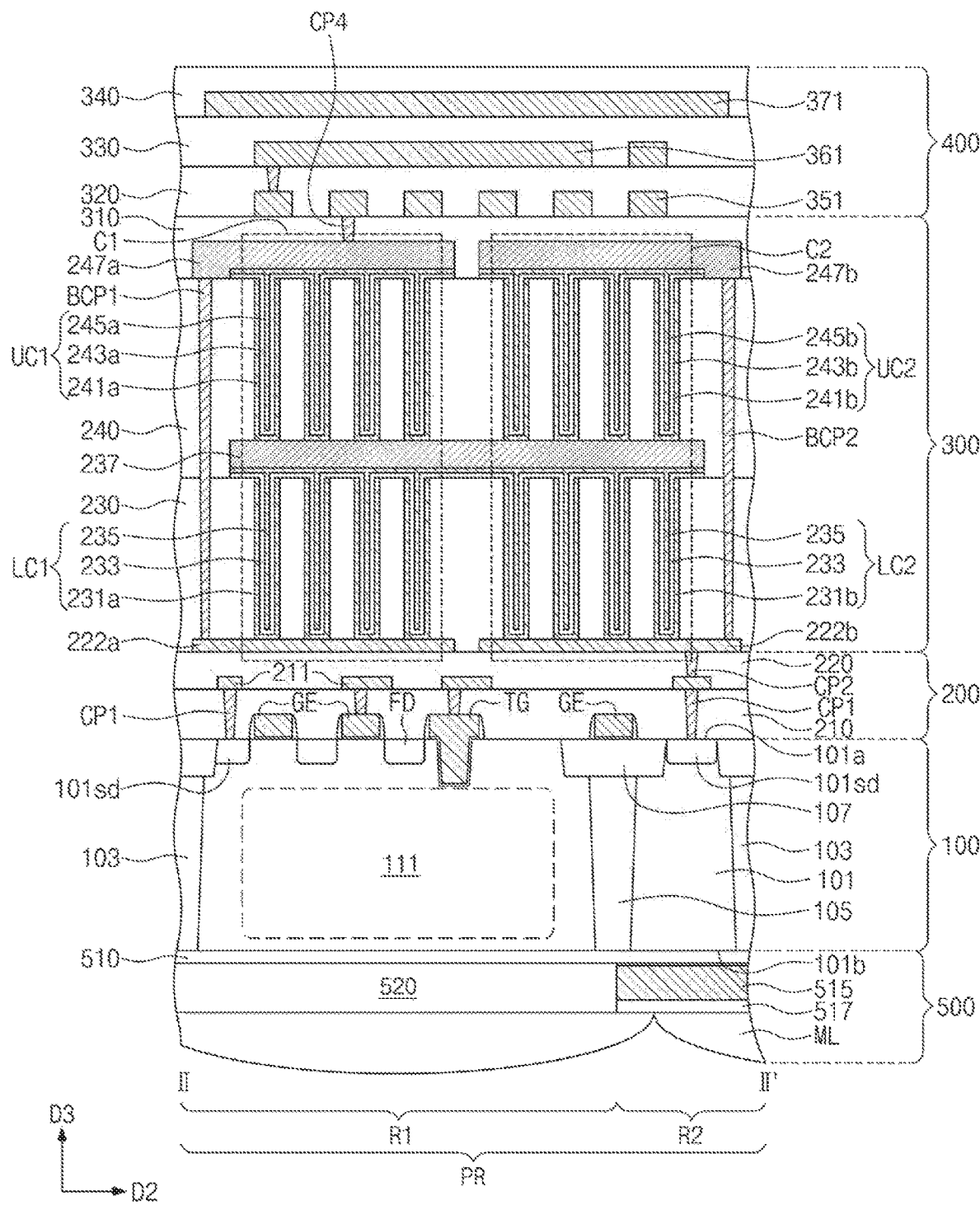

FIG. 5 is a schematic plan view illustrating an image sensor according to some embodiments. FIGS. 6A and 6B are cross-sectional views taken along lines I-I' and II-II' of FIG. 5, respectively, to illustrate an image sensor according to some embodiments.

Referring to FIGS. 5, 6A and 6B, an image sensor according to some embodiments may include a photoelectric conversion layer 100, an integrated circuit layer 200, a charge storage layer 300, an interconnection layer 400, and a light transmitting layer 500. The photoelectric conversion layer 100 may be disposed between the integrated circuit layer 200 and the light transmitting layer 500 when viewed in a vertical view. The charge storage layer 300 may be disposed between the interconnection layer 400 and the integrated circuit layer 200.

The photoelectric conversion layer 100 may include a semiconductor substrate 101, a pixel separation structure 103 defining pixel regions PR, and photoelectric conversion regions 111 provided in the semiconductor substrate 101. The integrated circuit layer 200 may be disposed on a first surface 101a of the semiconductor substrate 101. The integrated circuit layer 200 may include readout circuits electrically connected to the photoelectric conversion regions 111, and sampling circuits.

The integrated circuit layer 200 may include the reset transistor RX, the first and second source follower transistors SF1 and SF2, the sampling transistor SAM, the precharge transistor PC, the calibration transistor CAL, and the selection transistor SEL, described above with reference to FIGS. 3A to 3C.

The charge storage layer 300 may be disposed on the integrated circuit layer 200 and may include first and second capacitors C1 and C2 in each of the pixel regions PR. The first and second capacitors C1 and C2 may be connected to the readout circuits and the sampling circuits of the integrated circuit layer 200, as described with reference to FIG. 3A. In the charge storage layer 300, each of the first and second capacitors C1 and C2 may include a lower capacitor structure LC1 or LC2 between a lower pad electrode 222a or 222b and an intermediate pad electrode 237, and an upper capacitor structure UC1 or UC2 between the intermediate pad electrode 237 and an upper pad electrode 247a or 247b. That is, for example, the first capacitor C1 may include the lower capacitor structure LC1 between the lower pad electrode 222a and the intermediate pad electrode 237, and the upper capacitor structure UC1 between the intermediate pad electrode 237 and the upper pad electrode 247a.

The interconnection layer 400 may be disposed on the charge storage layer 300 and may include interconnection lines 351, 361 and 371 which are connected to the transistors of the integrated circuit layer 200 and the first and second capacitors C1 and C2 of the charge storage layer 300.

The light transmitting layer 500 may be disposed on a second surface 101b of the semiconductor substrate 101. The light transmitting layer 500 may include a planarization insulating layer 510, a light blocking pattern 515, a light filter layer 520, and micro lenses ML.

In more detail, the semiconductor substrate 101 may have the first surface (or a front surface) 101a and the second surface (or a back surface) 101b, which are opposite to each other. The semiconductor substrate 101 may be a bulk silicon substrate having a first conductivity type (e.g., a P-type).

The pixel separation structure 103 may be disposed in the semiconductor substrate 101 and may define a plurality of the pixel regions PR arranged in a matrix form along a first direction D1 and a second direction D2. The pixel separation structure 103 may surround each of the pixel regions PR when viewed in a plan view. In detail, the pixel separation structure 103 may include first portions extending in parallel to each other in the first direction D1, and second portions extending in parallel to each other in the second direction D2 to intersect the first portions.

The pixel separation structure 103 may be formed of an insulating material having a refractive index lower than that of the semiconductor substrate 101 (e.g., silicon) and may include one or more insulating layers. The pixel separation structure 103 may penetrate the semiconductor substrate 101. In other words, a vertical thickness of the pixel separation structure 103 may be substantially equal to a vertical thickness of the semiconductor substrate 101. Alternatively, the vertical thickness of the pixel separation structure 103 may be less than the vertical thickness of the semiconductor substrate 101.

An isolation structure 105 may penetrate the semiconductor substrate 101 of each of the pixel regions PR and may define a light receiving region R1 and a light blocking region R2. In other words, each of the pixel regions PR may include the light receiving region R1 and the light blocking region R2. The isolation structure 105 may extend in the first direction D1 or the second direction D2.

The isolation structure 105 may have substantially the same structure as the pixel separation structure 103. Like the pixel separation structure 103, the isolation structure 105 may be formed of an insulating material having a refractive index lower than that of the semiconductor substrate 101 (e.g., silicon) and may include one or more insulating layers.

The photoelectric conversion region 111 may be provided in the light receiving region R1 of each of the pixel regions PR. The photoelectric conversion region 111 may be formed by ion-implanting dopants of a second conductivity type into the semiconductor substrate 101. The second conductivity type may be opposite to the first conductivity type of the semiconductor substrate 101. Photodiodes may be formed by junction of the semiconductor substrate 101 having the first conductivity type and the photoelectric conversion regions 111 having the second conductivity type. Light incident from the outside may be converted into electrical signals in the photoelectric conversion regions 111.

A device isolation layer 107 may be disposed adjacent to the first surface 101a of the semiconductor substrate 100. The device isolation layer 107 may define active regions.

The transfer transistor TX, the reset transistor RX and the first source follower transistor SF1, described with reference to FIG. 3A, may be disposed on the first surface 101a of the semiconductor substrate 101 of the light receiving region R1. The sampling transistor SAM, the precharge transistor PC, the calibration transistor CAL, the selection transistor SEL and the second source follower transistor SF2, described with reference to FIG. 3A, may be disposed on the first surface 101a of the semiconductor substrate 101 of the light blocking region R2.

In each of the pixel regions PR, a transfer gate electrode TG and gate electrodes GE of the transistors described with reference to FIGS. 3A to 3C may be disposed on the first surface 101a of the semiconductor substrate 101.

A portion of the transfer gate electrode TG may be disposed in the semiconductor substrate 101, and a gate insulating layer may be disposed between the transfer gate electrode TG and the semiconductor substrate 101.

A floating diffusion region FD may be provided in the semiconductor substrate 101 at a side of the transfer gate electrode TG. In addition to the floating diffusion region FD, source/drain dopant regions 101sd of the transistors described with reference to FIGS. 3A to 3C may be provided in the semiconductor substrate 101.

The floating diffusion region FD and the source/drain dopant regions 101sd may be formed by ion-implanting dopants of which a conductivity type is opposite to that of the semiconductor substrate 101. For example, the floating diffusion region FD and the source/drain dopant regions 101sd may be N-type dopant regions.

A first interlayer insulating layer 210 may cover the first surface 101a of the semiconductor substrate 101 and the transistors. First interconnection lines 211 may be disposed on the first interlayer insulating layer 210. The first interconnection lines 211 may be electrically connected to the transistors through first contact plugs CP1.

A second interlayer insulating layer 220 may be disposed on the first interlayer insulating layer 210 and may cover the first interconnection lines 211. For example, each of the first and second interlayer insulating layers 210 and 220 may include at least one of silicon oxide, silicon nitride, or silicon oxynitride.

Second interconnection lines 221 and a first lower pad electrode 222a and a second lower pad electrode 222b may be disposed on the second interlayer insulating layer 220. The second interconnection lines 221 may be selectively connected to some of the first interconnection lines 211 through second contact plugs CP2. The second lower pad electrode 222b may be connected to at least one of the first interconnection lines 211 through one of the second contact plugs CP2. The second lower pad electrode 222b may be electrically connected to the gate electrode of the second source follower transistor and the source/drain dopant region of the calibration transistor through the first and second contact plugs CP1 and CP2 and the first interconnection lines 211.

The first and second lower pad electrodes 222a and 222b may be spaced apart from each other in each of the pixel regions PR (see FIG. 6B). The first and second lower pad electrodes 222a and 222b may have plate shapes. The first and second lower pad electrodes 222a and 222b may overlap with the photoelectric conversion region 111 when viewed in a plan view. The first and second lower pad electrodes 222a and 222b having the plate shapes may reflect light provided through the semiconductor substrate 101 toward the photoelectric conversion region 111.

The second interconnection lines 221 and the first and second lower pad electrodes 222a and 222b may include a first metal material, for example, a metal (e.g., tungsten, titanium, and/or tantalum) and/or a conductive metal nitride (e.g., titanium nitride, tantalum nitride, and/or tungsten nitride).

A lower mold insulating layer 230 may be disposed on the second interlayer insulating layer 220. The lower mold insulating layer 230 may cover the second interconnection lines 221 and the first and second lower pad electrodes 222a and 222b.

The lower mold insulating layer 230 may have a plurality of openings exposing the first and second lower pad electrodes 222a and 222b. The lower mold insulating layer 230 may include at least one of a silicon oxide layer, a silicon nitride layer, or a silicon oxynitride layer.

First and second lower capacitor structures LC1 and LC2 may be disposed in the lower mold insulating layer 230 (see FIG. 6B). The first lower capacitor structure LC1 may include first lower storage electrodes 231a, a lower dielectric layer pattern 233, and a lower plate electrode 235. The second lower capacitor structure LC2 may include second lower storage electrodes 231b, the lower dielectric layer pattern 233, and the lower plate electrode 235.

In more detail, the lower storage electrodes 231a and 231b may be disposed in the openings of the lower mold insulating layer 230, respectively. In some embodiments, the lower storage electrodes 231a and 231b may include a plurality of the first lower storage electrodes 231a disposed on the first lower pad electrode 222a, and a plurality of the second lower storage electrodes 231b disposed on the second lower pad electrode 222b.

The first lower storage electrodes 231a may be arranged in the first direction D1 and the second direction D2 on the first lower pad electrode 222a, and the first lower storage electrodes 231a adjacent to each other may be arranged to be offset from each other. In other words, the first lower storage electrodes 231a may be arranged in a zigzag form or a honeycomb form (see, e.g., FIG. 5). The second lower storage electrodes 231b adjacent to each other may be arranged to be offset from each other. The second lower storage electrodes 231b may be arranged in a zigzag form or a honeycomb form on the second lower pad electrode 222b, like the first lower storage electrodes 231a. For example, centers of at least two of the first or second lower storage electrodes 231a or 231b may be spaced apart from each other by substantially the same distance. Since the first and second lower storage electrodes 231a and 231b are arranged in the zigzag form or the honeycomb form as described above, diameters of the first and second lower storage electrodes 231a and 231b may be increased and the integration density of the first and second lower storage electrodes 231a and 231b may be improved. In certain embodiments, the first and second lower storage electrodes 231a and 231b may be arranged in a matrix form at equal distances in the first direction D1 and the second direction D2.

For example, each of the first and second lower storage electrodes 231a and 231b may have a cup shape conformally covering an inner surface of each of the openings of the lower mold insulating layer 230. In detail, each of the lower storage electrodes 231a and 231b may have a cylindrical shape which has a bottom portion and a sidewall portion vertically extending from an edge of the bottom portion to define an empty space. Top surfaces of the lower storage electrodes 231a and 231b may be located at substantially the same level as a top surface of the lower mold insulating layer 230.

The lower dielectric layer pattern 233 and the lower plate electrode 235 which conformally cover each of the first and second lower storage electrodes 231a and 231b may be sequentially stacked on the lower mold insulating layer 230. The lower dielectric layer pattern 233 may have a uniform thickness and may conformally cover inner surfaces of each of the first and second lower storage electrodes 231a and 231b. The lower plate electrode 235 may be disposed on the lower dielectric layer pattern 233 and may cover each of the first and second lower storage electrodes 231a and 231b. In other words, each of the lower dielectric layer pattern 233 and the lower plate electrode 235 may extend into the lower storage electrodes 231a and 231b in a finger-like arrangement. For example, portions of the lower dielectric layer pattern 223 may extend, respectively, between adjacent ones of the first lower storage electrodes 231a, and portions of the lower plate electrode 235 may extend, respectively, between adjacent ones of the first lower storage electrodes 231a.

The lower plate electrode 235 may cover a surface of the lower dielectric layer pattern 233 with a uniform thickness. For example, the lower plate electrode 235 may fill the openings in which the first and second lower storage electrodes 231a and 231b and the lower dielectric layer pattern 233 are formed. For another example, the lower plate electrode 235 may define gap regions in the openings of the lower mold insulating layer 230.

The first and second lower storage electrodes 231a and 231b and the lower plate electrode 235 may include a refractory metal layer (e.g., cobalt, titanium, nickel, tungsten, and/or molybdenum) and/or a metal nitride layer (e.g., a titanium nitride (TiN) layer, a titanium-silicon nitride (TiSiN) layer, a titanium-aluminum nitride (TiAlN) layer, a tantalum nitride (TaN) layer, a tantalum-silicon nitride (TaSiN) layer, a tantalum-aluminum nitride (TaAlN) layer, and/or a tungsten nitride (WN) layer).

For example, the lower dielectric layer pattern 233 may include a single layer or multi-layer including a metal oxide (e.g., $HfO_2$, $ZrO_2$, $Al_2O_3$, $La_2O_3$, $Ta_2O_3$, and/or $TiO_2$) and/or a perovskite dielectric material (e.g., $SrTiO_3$ (STO), (Ba,Sr)$TiO_3$ (BST), $BaTiO_3$, PZT, and/or PLZT).

The intermediate pad electrode 237 may be disposed on the lower plate electrode 235. The intermediate pad electrode 237 may include a doped semiconductor material or a conductive material, which is different from that of the lower plate electrode 235. For example, the intermediate pad electrode 237 may include poly-silicon or silicon-germanium doped with dopants, and/or a metal (e.g., tungsten, copper, aluminum, titanium, and/or tantalum).

The intermediate pad electrode 237 may overlap with the first and second lower pad electrodes 222a and 222b when viewed in a plan view. In some embodiments, the thickness of the intermediate pad electrode 237 may be greater than thicknesses of the first and second lower pad electrodes 222a and 222b. In some embodiments, the intermediate pad electrode 237 may be in direct contact with a top surface of the lower plate electrode 235 disposed on the top surface of the lower mold insulating layer 230.

The upper mold insulating layer 240 may be disposed on the lower mold insulating layer 230 and may cover the intermediate pad electrode 237. The upper mold insulating layer 240 may have a plurality of openings exposing the intermediate pad electrode 237. The upper mold insulating layer 240 may include at least one of a silicon oxide layer, a silicon nitride layer, or a silicon oxynitride layer. A thickness of the upper mold insulating layer 240 may be equal to or different from a thickness of the lower mold insulating layer 230.

First and second upper capacitor structures UC1 and UC2 may be disposed in the upper mold insulating layer 240 (see FIG. 6B). The first upper capacitor structure UC1 may include first upper storage electrodes 241a, a first upper dielectric layer pattern 243a, and a first upper plate electrode 245a. The second upper capacitor structure UC2 may include second upper storage electrodes 241b, a second upper dielectric layer pattern 243b, and a second upper plate electrode 245b.

In more detail, the upper storage electrodes 241a and 241b may be disposed in the openings of the upper mold insulating layer 240, respectively. In some embodiments, the upper storage electrodes 241a and 241b may include the first upper storage electrodes 241a disposed on the first lower storage electrodes 231a, and the second upper storage electrodes 241b disposed on the second lower storage electrodes 231b.

The first and second upper storage electrodes 241a and 241b may be electrically connected to the lower plate electrode 235 through the intermediate pad electrode 237. The first and second upper storage electrodes 241a and 241b may be arranged in a zigzag form or a honeycomb form, like the first and second lower storage electrodes 231a and 231b (see, e.g., FIG. 5). In addition, each of the first and second upper storage electrodes 241a and 241b may have a cup shape or cylindrical shape conformally covering an inner surface of each of the openings of the upper mold insulating layer 240, like the first and second lower storage electrodes 231a and 231b. Top surfaces of the first and second upper storage electrodes 241a and 241b may be located at substantially the same level as a top surface of the upper mold insulating layer 240. In some embodiments, the first and second upper storage electrodes 241a and 241b may include the same conductive material as the first and second lower storage electrodes 231a and 231b.

The first upper dielectric layer pattern 243a and the first upper plate electrode 245a which conformally cover a plurality of the first upper storage electrodes 241a may be sequentially stacked on the upper mold insulating layer 240. In other words, each of the first upper dielectric layer pattern 243a and the first upper plate electrode 245a may extend into the first upper storage electrodes 241a in a finger-like arrangement. For example, portions of the first upper dielectric layer pattern 243a may extend, respectively, between adjacent ones of the first upper storage electrodes 241a, and portions of the first upper plate electrode 245a may extend, respectively, between adjacent ones of the first upper storage electrodes 241a. The second upper dielectric layer pattern 243b and the second upper plate electrode 245b which conformally cover a plurality of the second upper storage electrodes 241b may be sequentially stacked on the upper mold insulating layer 240. In other words, each of the second upper dielectric layer pattern 243b and the second upper plate electrode 245b may extend into the second upper storage electrodes 241b in a finger-like arrangement. For example, portions of the second upper dielectric layer pattern 243b may extend, respectively, between adjacent ones of the second upper storage electrodes 241b, and portions of the second upper plate electrode 245b may extend, respectively, between adjacent ones of the second upper storage electrodes 241b.

The first and second upper dielectric layer patterns 243a and 243b may have uniform thicknesses and may cover inner surfaces of the first and second upper storage electrodes 241a and 241b, respectively. The first and second upper plate electrodes 245a and 245b may be disposed on the first and second upper dielectric layer patterns 243a and 243b, respectively, and may cover the first and second upper storage electrodes 241a and 241b, respectively. The first and second upper plate electrodes 245a and 245b may be spaced apart from each other, like the first and second lower pad electrodes 222a and 222b.

In some embodiments, the first and second upper dielectric layer patterns 243a and 243b may include the same dielectric material as the lower dielectric layer pattern 233. In other embodiments, the first and second upper dielectric layer patterns 243a and 243b may include a different dielectric material from that of the lower dielectric layer pattern 233.

The first and second upper plate electrodes 245a and 245b may cover surfaces of the first and second upper dielectric layer patterns 243a and 243b, respectively, with uniform thicknesses. The first and second upper plate electrodes 245a and 245b may fill the openings in which the first and second upper storage electrodes 241a and 241b and the first and second upper dielectric layer patterns 243a and 243b are formed, respectively. In some embodiments, the first and second upper plate electrodes 245a and 245b may include the same conductive material as the lower plate electrode 235.

The first and second upper pad electrodes 247a and 247b may be disposed on the first and second upper plate electrodes 245a and 245b, respectively. In some embodiments, the first and second upper pad electrodes 247a and 247b may include a doped semiconductor material or conductive material, which is different from that of the first and second upper plate electrodes 245a and 245b. For example, the first and second upper pad electrodes 247a and 247b may include poly-silicon or silicon-germanium doped with dopants, and/or a metal (e.g., tungsten, copper, aluminum, titanium, and/or tantalum).

The first and second upper pad electrodes 247a and 247b may overlap with the first and second lower pad electrodes 222a and 222b, respectively, when viewed in a plan view (see, e.g., FIG. 6B). In some embodiments, thicknesses of the first and second upper pad electrodes 247a and 247b may be greater than thicknesses of the first and second lower pad electrodes 222a and 222b. A third interlayer insulating layer 310 may be disposed on the upper mold insulating layer 240 and may cover the first and second upper pad electrodes 247a and 247b.

A first lower contact plug BCP1 may penetrate the lower and upper mold insulating layers 230 and 240 so as to be connected to the first lower pad electrode 222a. A second lower contact plug BCP2 may penetrate the lower and upper mold insulating layers 230 and 240 so as to be connected to the second lower pad electrode 222b.

The first upper pad electrode 247a may be connected to the first lower contact plug BCP1, and the second upper pad electrode 247b may be connected to the second lower contact plug BCP2. In other words, the first lower storage electrodes 231a may be electrically connected to the first upper plate electrode 245a, and the second lower storage electrodes 231b may be electrically connected to the second upper plate electrode 245b.

In some embodiments, the first lower pad electrode 222a, the intermediate pad electrode 237, the first upper pad electrode 247a, the first lower capacitor structure LC1 and the first upper capacitor structure UC1 may constitute the first capacitor C1 described with reference to FIG. 3A. The second lower capacitor structure LC2 between the second lower pad electrode 222b and the intermediate pad electrode 237 and the second upper capacitor structure UC2 between the intermediate pad electrode 237 and the second upper pad electrode 247b may constitute the second capacitor C2 described with reference to FIG. 3A. Here, the intermediate pad electrode 237 may be connected in common to the first and second capacitors C1 and C2.

An upper contact plug TCP may penetrate the third interlayer insulating layer 310 and the upper mold insulating layer 240 so as to be connected to the intermediate pad electrode 237. A third contact plug CP3 may penetrate the third interlayer insulating layer 310 and the upper and lower mold insulating layers 230 and 240 so as to be connected to at least one of the second interconnection lines 221.

In some embodiments, the upper contact plug TCP, the first and second lower contact plugs BCP1 and BCP2 and the third contact plug CP3 may include the same metal material. In some embodiments, the upper contact plug TCP, the first and second lower contact plugs BCP1 and BCP2 and the third contact plug CP3 may include the same metal material (i.e., the first metal material) as the first and second interconnection lines 211 and 221. For example, the first metal material may include a metal (e.g., tungsten, titanium, and/or tantalum) and/or a conductive metal nitride (e.g., titanium nitride, tantalum nitride, and/or tungsten nitride).

Third interconnection lines 351 may be disposed on the third interlayer insulating layer 310. At least one of the third interconnection lines 351 may be electrically connected to at least one of the second interconnection lines 221 through the third contact plug CP3. Another of the third interconnection lines 351 may be connected to the first upper pad electrode 237a through a fourth contact plug CP4. At least another of the third interconnection lines 351 may have a line shape extending in one direction and may be connected to the intermediate pad electrode 237 through the upper contact plug TCP.

In some embodiments, third and fourth interconnection lines 351 and 361 disposed at higher levels than a top surface of the third interlayer insulating layer 310 may include a second metal material different from the first metal material of the first and second interconnection lines 211 and 221 disposed under the top surface of the third interlayer insulating layer 310. A resistivity of the second metal material may be less than that of the first metal material. For example, the second metal material may include copper or a copper alloy.

Some of the third interconnection lines 351 may intersect a plurality of the pixel regions PR and may include power lines to which the power voltage and the capacitor voltage are applied. Since the third interconnection lines 351 are formed of the second metal material having the low resistivity, signal delay may be reduced. A fourth interlayer insulating layer 320 may cover the third interlayer insulating layer 310 and the third interconnection lines 351. The fourth interconnection lines 361 may be disposed on the fourth interlayer insulating layer 320, and a fifth interlayer insulating layer 330 covering the fourth interconnection lines 361 may be disposed on the fourth interlayer insulating layer 320. A fifth interconnection line 371 may be disposed on the fifth interlayer insulating layer 330. In some embodiments, the fifth interconnection line 371 may have a plate shape covering each of the pixel regions PR. A sixth interlayer insulating layer 340 covering the fifth interconnection line 371 may be disposed on the fifth interlayer insulating layer 330.

The planarization insulating layer 510 may cover the second surface 101b of the semiconductor substrate 101. The planarization insulating layer 510 may be formed of an insulating material having a different refractive index from that of the semiconductor substrate 101. The light blocking pattern 515 may be disposed on the planarization insulating layer 510 in the light blocking region R2. The light blocking pattern 515 may reflect and block light incident to the second surface 101b of the semiconductor substrate 101. In other words, light incident to the light blocking region R2 of each of the pixel regions PR may be blocked by the light blocking pattern 515, and thus the light blocking pattern 515 may prevent photocharges from being generated in the semiconductor substrate 101 of the light blocking region R2 and may also prevent light from being incident to the sampling circuit formed on the first surface 101a of the semiconductor substrate 101 in the light blocking region R2. For example, the light blocking pattern 515 may be formed of a metal material such as tungsten or aluminum. A buffer insulating layer 517 covering the light blocking pattern 515 may be disposed on the planarization insulating layer 510 of the light blocking region R2.

The light filter layer 520 may be disposed on the second surface 101b of the semiconductor substrate 101 in the light receiving region R1. The light filter layer 520 may transmit light of a specific wavelength band in incident light provided from the outside. The light filter layer 520 may include color filters and/or an infrared filter.

The micro lenses ML respectively corresponding to the photoelectric conversion regions 111 may be disposed on the light filter layer 520. The micro lenses ML may be two-dimensionally arranged in the first and second directions D1 and D2 intersecting each other. Each of the micro lenses ML may have a convex shape and may have a specific radius of curvature.

In some embodiments, the photoelectric conversion layer 100, the integrated circuit layer 200, the charge storage layer 300 and the interconnection layer 400 may together form an upper layer of the image sensor, and the image sensor may further include a lower layer comprising a substrate and one or more additional layer comprising a plurality of logic gates, where the upper and lower layers are bonded together. Alternatively, in other embodiments, the photoelectric conversion layer 100, the integrated circuit layer 200, the charge storage layer 300 and the interconnection layer 400 may together form a lower layer of the image sensor, and the image sensor may further include an upper layer comprising a substrate and one or more additional layers comprising a plurality of logic gates, where the upper and lower layers are bonded together. That is, the stacked capacitor shown in FIGS. 5, 6A, and 6B may be included in a lower layer of the image sensor, or an upper layer of the image sensor.

FIGS. 7 to 11 are cross-sectional views illustrating image sensors according to some embodiments. Hereinafter, for the purpose of ease and convenience in explanation, the same components as in the above embodiments shown in FIGS. 6A and 6B will be indicated by the same reference numerals or designators, and the descriptions thereof will be omitted.

Figure 7:
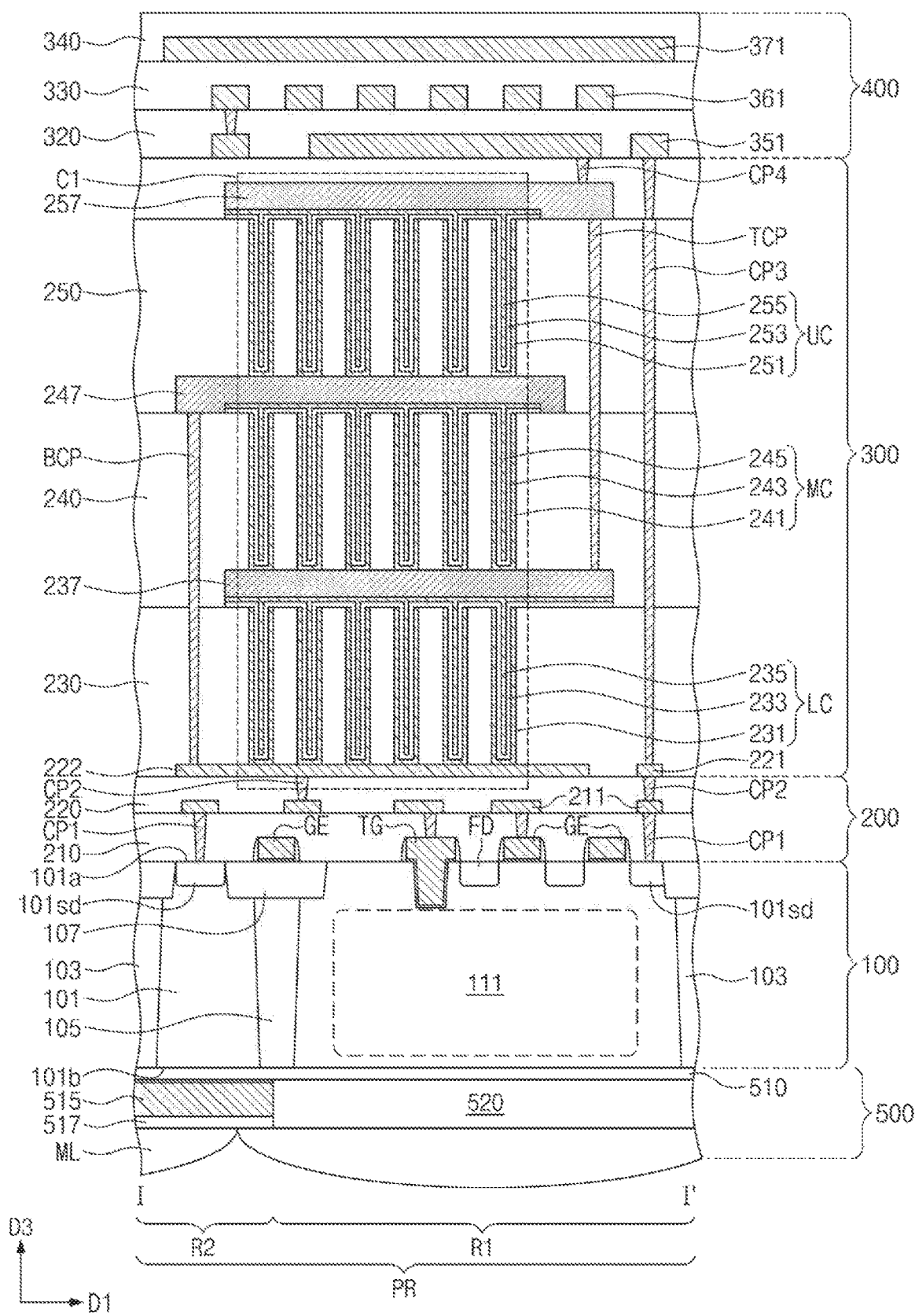
FIGS. 7 to 18 are cross-sectional views illustrating image sensors according to some embodiments.

Referring to FIG. 7, a lower pad electrode 222, the first intermediate pad electrode 237, a second intermediate pad electrode 247, and an upper pad electrode 257 may be vertically stacked on the semiconductor substrate 101 of each of the pixel regions PR. A lower capacitor structure LC may be provided between the lower pad electrode 222 and the first intermediate pad electrode 237, and an intermediate capacitor structure MC may be provided between the first and second intermediate pad electrodes 237 and 247. In addition, an upper capacitor structure UC may be provided between the second intermediate pad electrode 247 and the upper pad electrode 257.

Each of the lower, intermediate and upper capacitor structures LC, MC and UC may include a plurality of storage electrodes 231, 241 or 251, a dielectric layer pattern 233, 243 or 253, and a plate electrode 235, 245 or 255. The plurality of storage electrodes 251, the dielectric layer pattern 253, and the plate electrode 255 may have a similar configuration as that of the plurality of storage electrodes 231 or 241, the dielectric layer pattern 233 or 243, and the plate electrode 235 or 245, respectively. The lower pad electrode 222, the first and second intermediate pad electrodes 237 and 247, the upper pad electrode 257 and the lower, intermediate and upper capacitor structures LC, MC and UC may constitute one of the first and second capacitors C1 and C2 described with reference to FIG. 3A.

In some embodiments, a lower contact plug BCP may electrically connect the lower pad electrode 222 to the second intermediate pad electrode 247, and an upper contact plug TCP may electrically connect the first intermediate pad electrode 237 to the upper pad electrode 257. In other words, the storage electrodes 231 of the lower capacitor structure LC, the plate electrode 245 of the intermediate capacitor structure MC and the storage electrodes 251 of the upper capacitor structure UC may be electrically connected to each other. In addition, the plate electrode 235 of the lower capacitor structure LC, the storage electrodes 241 of the intermediate capacitor structure MC and the plate electrode 255 of the upper capacitor structure UC may be electrically connected to each other.

In the embodiment illustrated in FIG. 7, three capacitor structures LC, MC and UC are stacked. However, in certain embodiments, the number of the stacked capacitor structures may be four or more, and pad electrodes may be provided between the capacitor structures, respectively. In an embodiment in which four or more stacked capacitor structures are provided, odd-numbered pad electrodes may be electrically connected to each other, and even-numbered pad electrodes may be electrically connected to each other. The number of the stacked capacitor structures may be increased and the capacitor structures may be electrically connected in parallel to each other as described above, and thus the capacitance of the first and/or second capacitors C1 and/or C2 of FIG. 3A may be increased.

Figure 8:
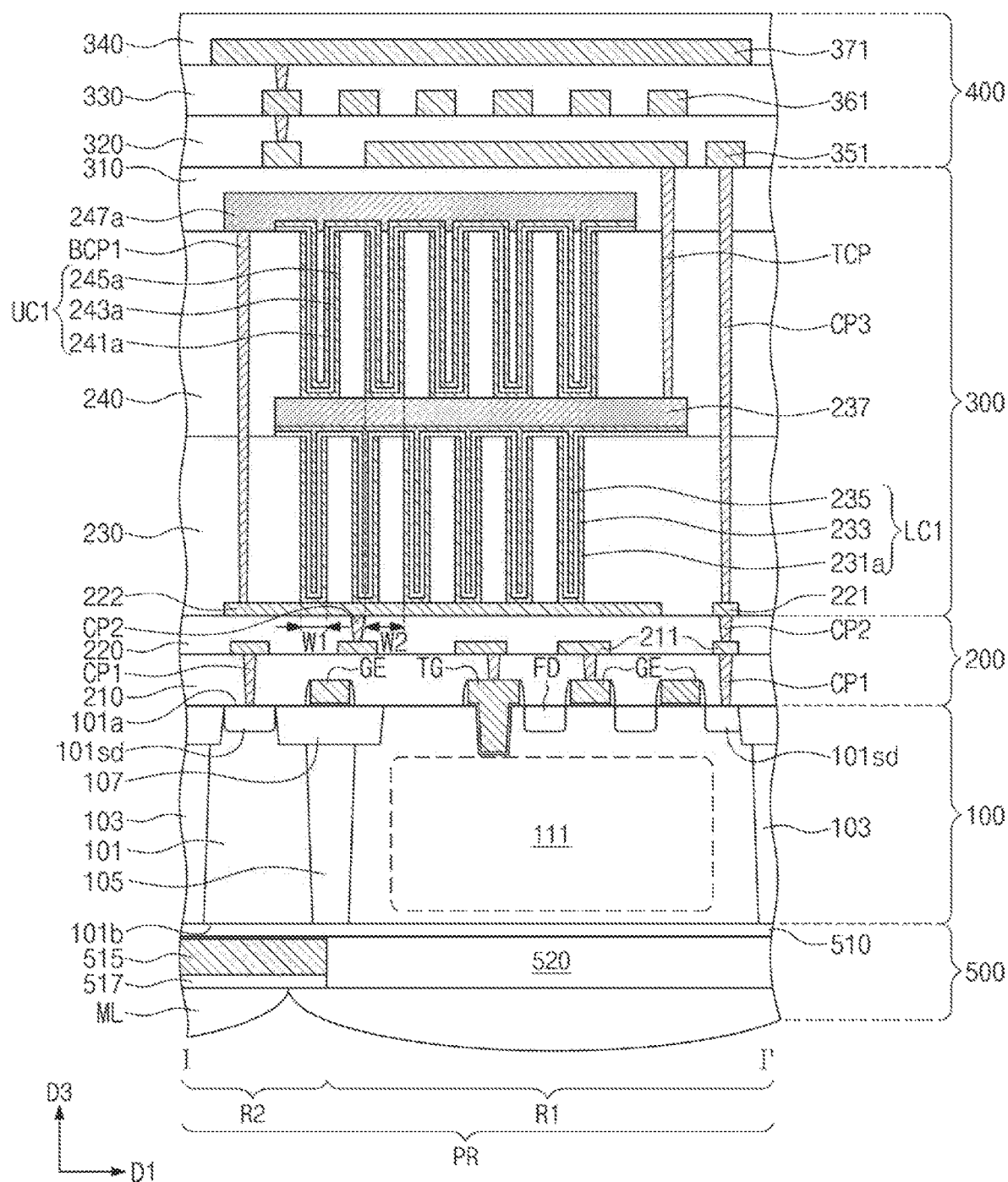

Referring to FIG. 8, each of lower and upper capacitor structures LC1 and UC1 may include storage electrodes 231a or 241a, a dielectric layer pattern 233 or 243a, and a plate electrode 235 or 245a.

A width W1 of the lower storage electrode 231a of the lower capacitor structure LC1 may be different from a width W2 of the upper storage electrode 241a of the upper capacitor structure UC1. For example, the width W1 of the lower storage electrode 231a may be less than the width W2 of the upper storage electrode 241a. In certain embodiments, additionally or alternatively a distance between the lower storage electrodes 231a adjacent to each other may be different from a distance between the upper storage electrodes 241a adjacent to each other. In certain embodiments, alternatively or additionally a height of the lower storage electrode 231a (in the direction D3) may be different from a height of the upper storage electrode 241a.

Figure 9:
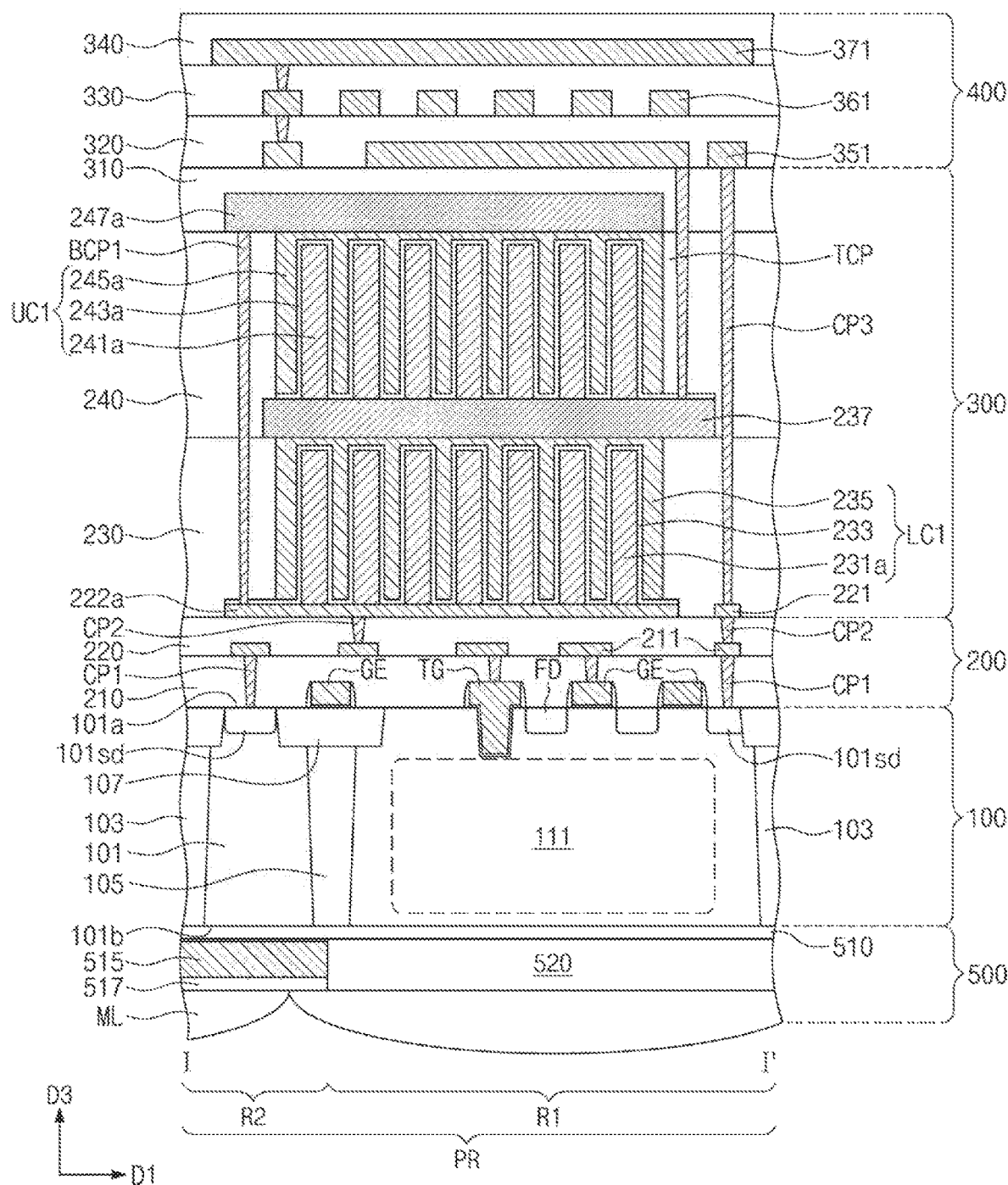

Referring to FIG. 9, each of lower and upper capacitor structures LC1 and UC1 may include storage electrodes 231a or 241a, a dielectric layer pattern 233 or 243a, and a plate electrode 235 or 245a.

Lower and upper storage electrodes 231a and 241a may have pillar shapes. For example, in some embodiments, the width of each of the storage electrodes 231a may be greater than a width of each of portions of the plate electrode 235 that extend between the storage electrodes 231a, and a width of each of the storage electrodes 241a may be greater than a width of each of the portions of the plate electrode 245a that extend between the storage electrodes 241a. In some embodiments, width and/or heights of the lower and upper storage electrodes 231a and 241a may be equal to or different from each other. The lower and upper storage electrodes 231a and 241a having the pillar shapes may be arranged in a zigzag form or a honeycomb form, as described above.

Lower and upper dielectric layer patterns 233 and 243a may have uniform thicknesses and may cover outer surfaces of the lower and upper storage electrodes 231a and 241a. The lower dielectric layer pattern 233 may cover the lower pad electrode 222a between the lower storage electrodes 231a. The upper dielectric layer pattern 243a may cover the intermediate pad electrode 237 between the upper storage electrodes 241a.

The lower plate electrode 235 may be disposed on the lower dielectric layer pattern 233 to cover a plurality of the lower storage electrodes 231a and may fill a space between the lower storage electrodes 231a. The upper plate electrode 245a may be disposed on the upper dielectric layer pattern 243a to cover a plurality of the upper storage electrodes 241a and may fill a space between the upper storage electrodes 241a.

In FIG. 9, both the lower and upper storage electrodes 231a and 241a have the pillar shapes. However, embodiments are not limited thereto. In certain embodiments, one of the lower and upper storage electrodes 231a and 241a may have the pillar shape, and the other of the lower and upper storage electrodes 231a and 241a may have the cylindrical shape described with reference to FIG. 6A.

Figure 10:
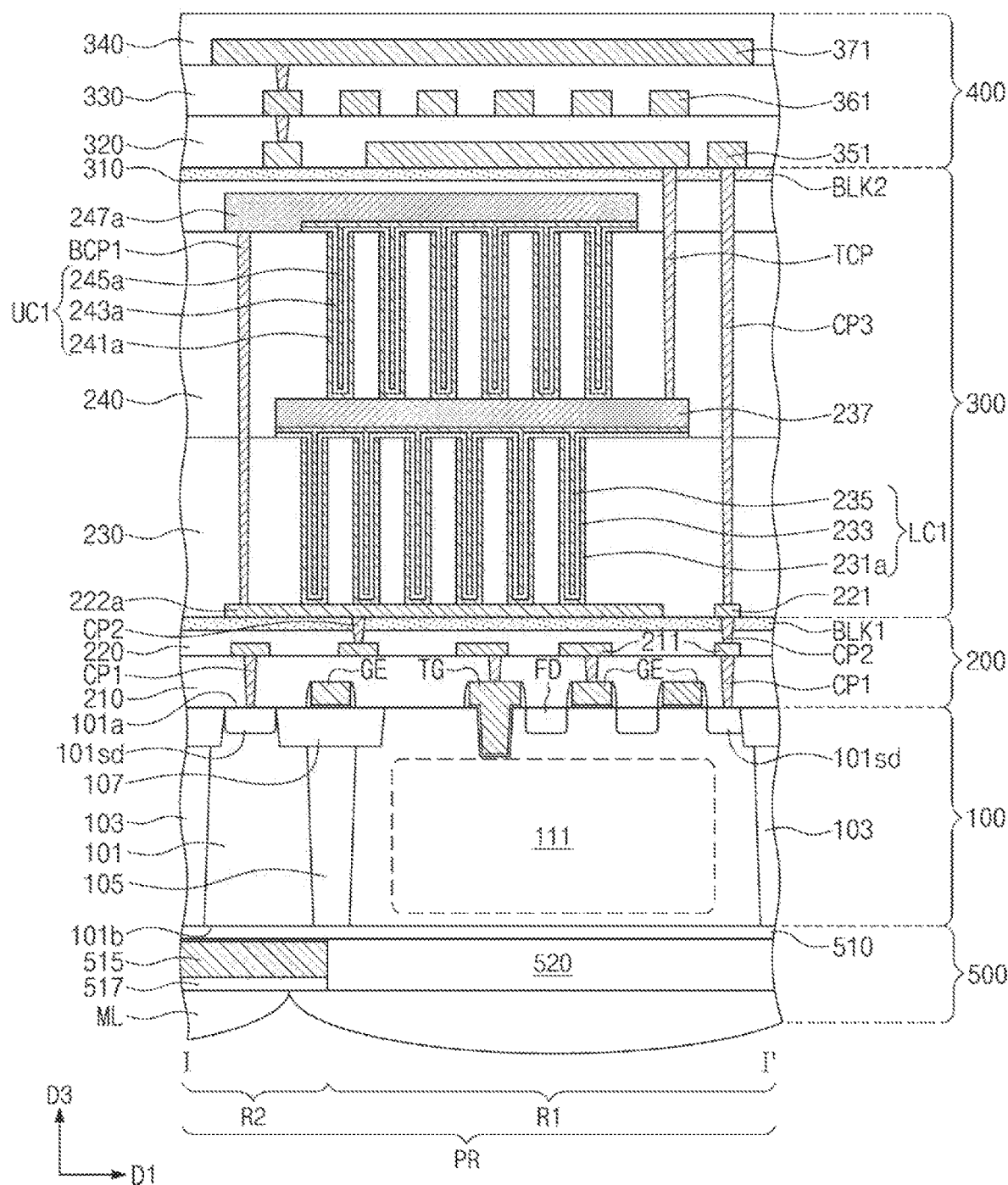

Referring to FIG. 10, an image sensor may further include a lower blocking insulating layer BLK1 between the integrated circuit layer 200 and the charge storage layer 300 and an upper blocking insulating layer BLK2 between the charge storage layer 300 and the interconnection layer 400. For example, the lower and upper blocking insulating layers BLK1 and BLK2 may include an insulating material such as SiN, SiON, SiC, SiCN, SiOCH, SiOC, and/or SiOF. In some embodiments, the lower and upper blocking insulating layers BLK1 and BLK2 may have the same insulating material. In other embodiments, the material of the lower and upper blocking insulating layers BLK1 and BLK2 may be different.

The lower and upper blocking insulating layers BLK1 and BLK2 may prevent hydrogen or deuterium from permeating into the lower and upper capacitor structures LC1 and UC1 in a hydrogen (H2) or deuterium annealing process performed in manufacturing of the image sensor. Thus, it is possible to prevent deterioration of an interface between the dielectric layer pattern 233 or 243a and the storage electrodes 231a or 241a (or the plate electrode 235 or 245a) in each of the lower and upper capacitor structures LC1 and UC1.

Figure 11:
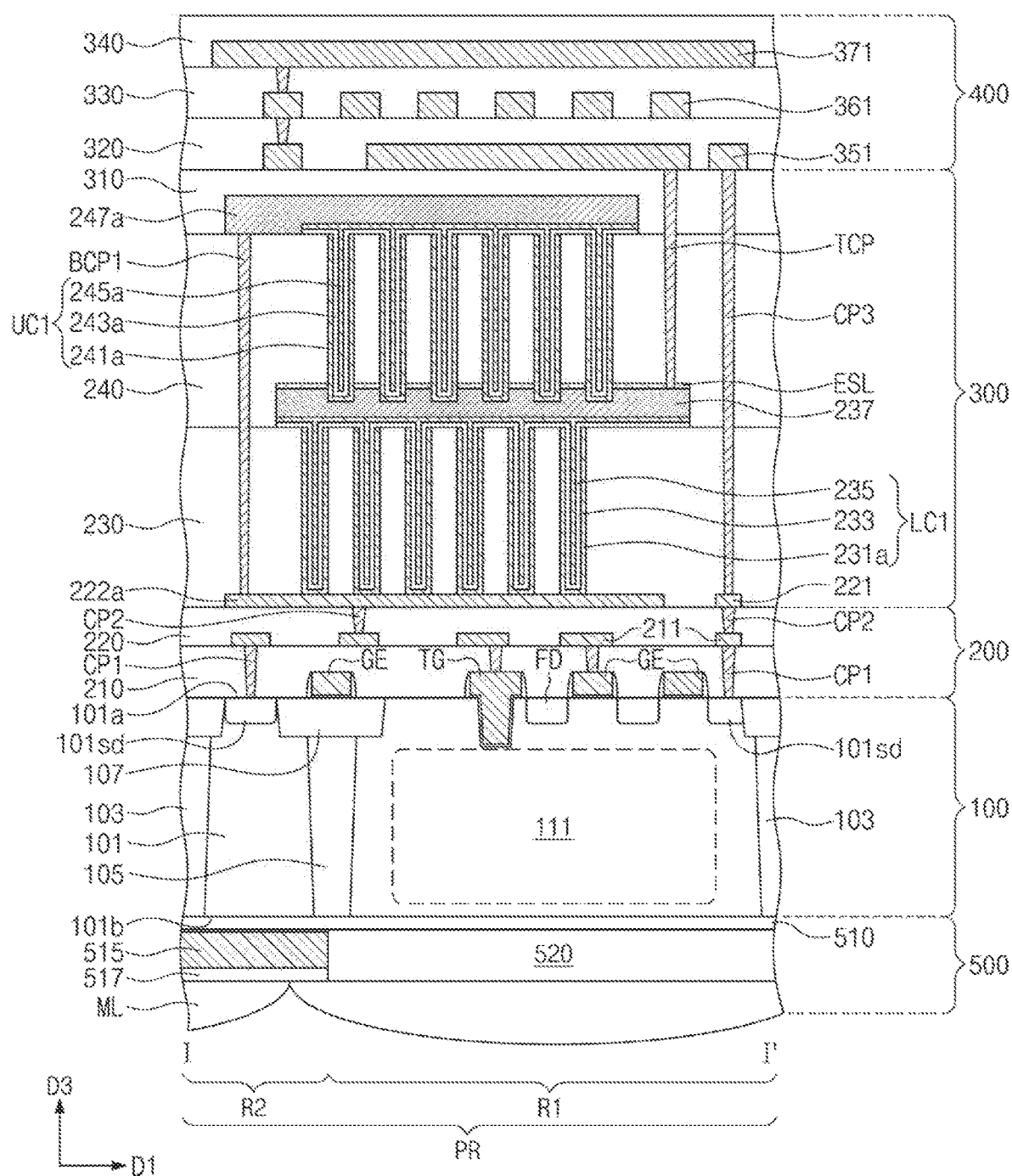

Referring to FIG. 11, an etch stop layer ESL may be disposed on the top surface of the intermediate pad electrode 237. The etch stop layer ESL may include an insulating layer having an etch selectivity with respect to the upper mold insulating layer 240. When the upper mold insulating layer 240 is formed of silicon oxide, the etch stop layer ESL may include silicon nitride or silicon oxynitride.

In some embodiments, the upper storage electrodes 241a of the upper capacitor structure UC1 may penetrate the etch stop layer ESL so as to be connected to the intermediate pad electrode 237. In this configuration, the lower portions of the upper storage electrodes 241a may be located in the intermediate pad electrode 237. In other words, bottom surfaces of the upper storage electrodes 241a may be lower than the top surface of the intermediate pad electrode 237.

Figure 12:
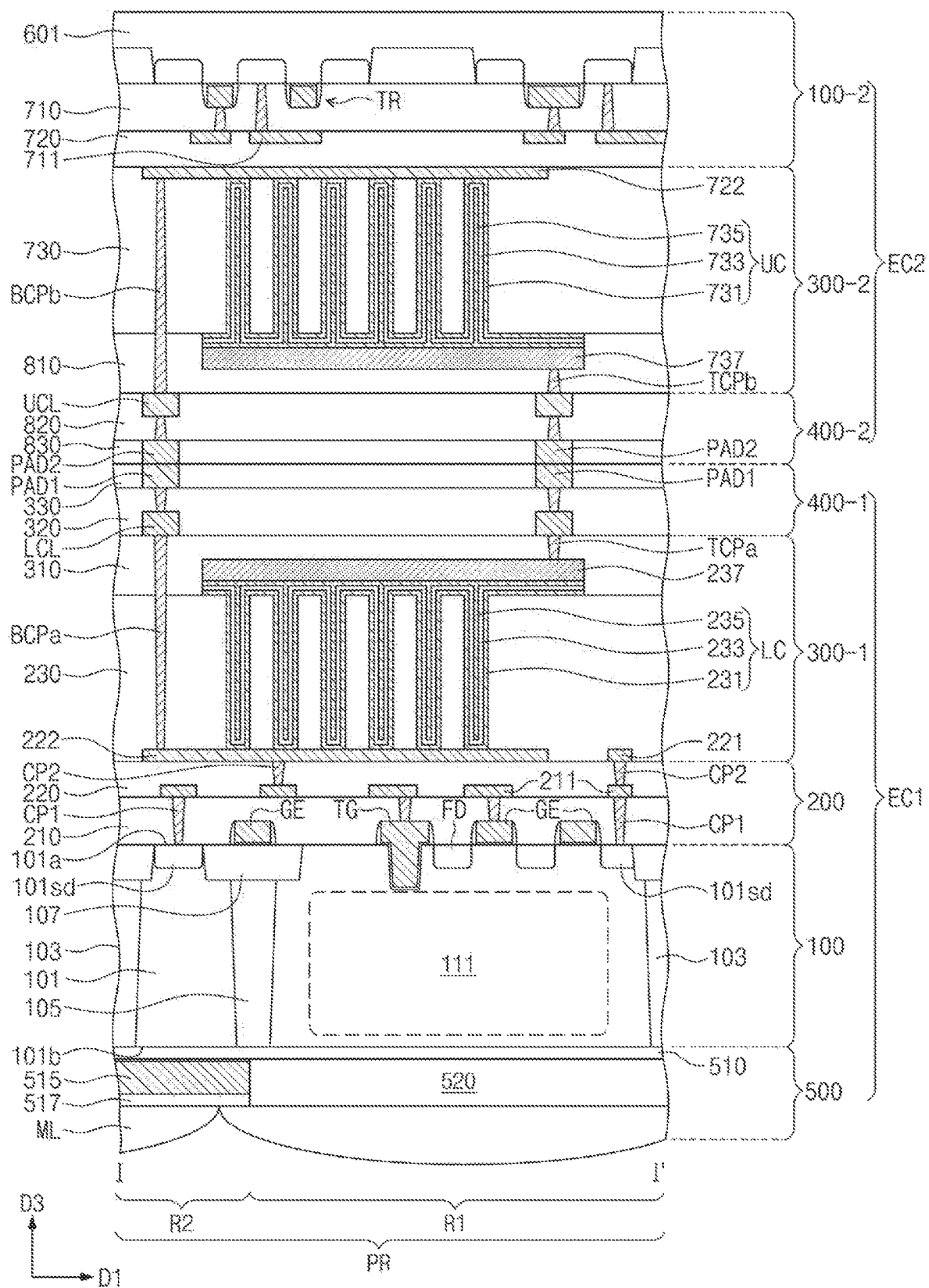

Referring to FIG. 12, an image sensor according to some embodiments may include a lower electronic device EC1 and an upper electronic device EC2.

The lower electronic device EC1 may include a photoelectric conversion layer 100, an integrated circuit layer 200, a first charge storage layer 300-1, a lower interconnection layer 400-1, and a light transmitting layer 500. The photoelectric conversion layer 100 and the integrated circuit layer 200 of the lower electronic device EC1 may be substantially the same as the photoelectric conversion layer 100 and the integrated circuit layer 200 described above with reference to FIGS. 6A and 6B, and thus the descriptions thereto will be omitted.

The first charge storage layer 300-1 may include a first mold layer 230, a first interlayer insulating layer 310 stacked below the first mold layer 230, and a lower capacitor structure LC between a first pad electrode 222 and a second pad electrode 237. A first lower contact plug BCPa may be connected to the first pad electrode 222, and a first upper contact plug TCPa may be connected to the second pad electrode 237. The first pad electrode 222, the second pad electrode 237 and the lower capacitor structure LC in the present embodiment may be substantially the same as the lower pad electrode, the intermediate pad electrode and the lower capacitor structure described with reference to FIGS. 6A and 6B, and the descriptions thereto will be omitted.

The lower interconnection layer 400-1 may include first interlayer insulating layers 320 and 330 and lower conductive lines LCL in the first interlayer insulating layers 320 and 330. In addition, the lower interconnection layer 400-1 may include lower conductive pads PAD1 electrically connected to the lower conductive lines LCL.

The upper electronic device EC2 may include a semiconductor device layer 100-2, a second charge storage layer 300-2, and an upper interconnection layer 400-2.

The semiconductor device layer 100-2 may include an upper semiconductor substrate 601, transistors TR formed on the upper semiconductor substrate 601, and conductive lines 711 connected to the transistors TR. The semiconductor device layer 1002 may be electrically connected to the integrated circuit layer 100 of the lower electronic device EC1. The semiconductor device layer 100-2 may include, for example, logic elements for processing data. For another example, the semiconductor device layer 100-2 may include memory elements for storing data. Lower interlayer insulating layers 710 and 720 covering the transistors TR may be stacked on the upper semiconductor substrate 601, i.e., between the upper semiconductor substrate 601 and the second charge storage layer 300-2.

The second charge storage layer 300-2 may include a second mold layer 730, a second interlayer insulating layer 810 stacked below the second mold layer 730, and an upper capacitor structure UC between a third pad electrode 722 and a fourth pad electrode 737. A second lower contact plug BCPb may be connected to the third pad electrode 722, and a second upper contact plug TCPb may be connected to the fourth pad electrode 737. The upper capacitor structure UC may include storage electrodes 731, a dielectric layer pattern 733, and a plate electrode 735, and may be similar to the storage electrodes 231, the dielectric layer pattern 233 and the plate electrode 235 as described with reference to FIG. 6A.

The upper interconnection layer 400-2 may include second interlayer insulating layers 820 and 830 and upper conductive lines UCL in the second interlayer insulating layers 820 and 830. In addition, the upper interconnection layer 400-2 may include upper conductive pads PAD2 electrically connected to the upper conductive lines UCL.

The upper conductive pads PAD2 may be disposed to correspond to the lower conductive pads PAD1. Sizes and arrangement of the upper conductive pads PAD2 may be substantially the same as sizes and arrangement of the lower conductive pads PAD1. The upper conductive pads PAD2 of the upper electronic device EC2 may be connected directly to the lower conductive pads PAD1 of the lower electronic device EC1. In other words, the lower and upper electronic devices EC1 and EC2 may be bonded to each other in such a way that the lower and upper conductive pads PAD1 and PAD2 are in contact with each other. The lower and upper conductive pads PAD1 and PAD2 may include a metal (e.g., copper (Cu), nickel (Ni), cobalt (Co), tungsten (W), titanium (Ti), or tin (Sn)) and/or any alloy thereof. For example, in some embodiments, the lower and upper electronic devices EC1 and EC2 may be bonded to each other by copper to copper bonding.

In some embodiments, the first and third pad electrodes 222 and 722 may be electrically connected to each other through the first and second lower contact plugs BCPa and BCPb and corresponding lower and upper conductive pads PAD1 and PAD2. The second and fourth pad electrodes 237 and 737 may be electrically connected to each other through the first and second upper contact plugs TCPa and TCPb and corresponding lower and upper conductive pads PAD1 and PAD2.

FIGS. 13 to 16 are cross-sectional views illustrating image sensors according to some embodiments. Hereinafter, for the purpose of ease and convenience in explanation, the same components as in the above embodiments of FIG. 12 will be indicated by the same reference numerals or designators, and the descriptions thereto will be omitted.

Figure 13:
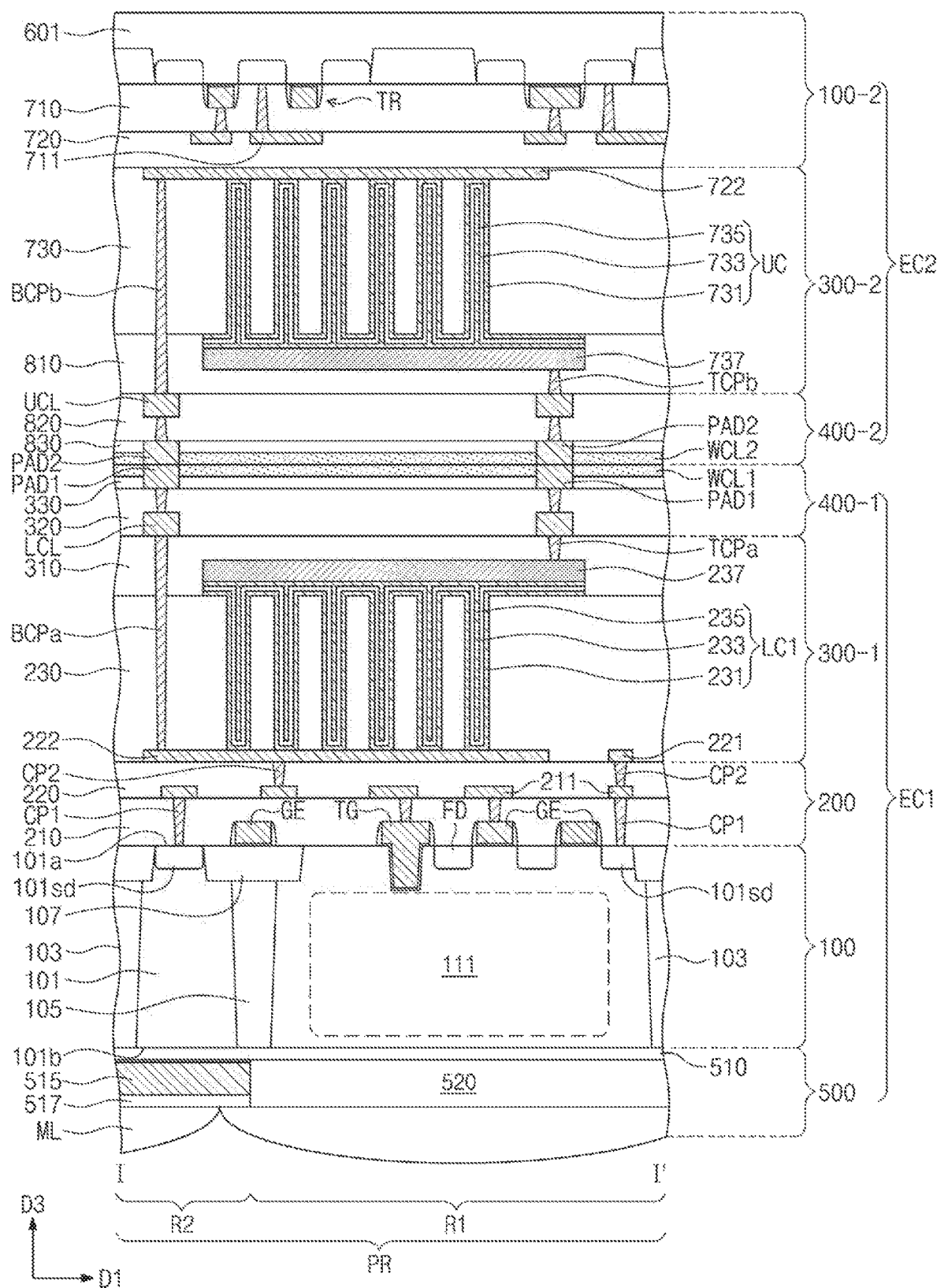

Referring to FIG. 13, the lower interconnection layer 400-1 of the lower electronic device EC1 may include a lower warpage control layer WCL1 disposed at the uppermost layer of the lower interconnection layer 400-1, and the upper interconnection layer 400-2 of the upper electronic device EC2 may include an upper warpage control layer WCL2 disposed at a lowermost layer of the upper interconnection layer 400-2.

The lower and upper electronic devices EC1 and EC2 may be bonded to each other in such a way that the lower and upper warpage control layers WCL1 and WCL2 are in contact with each other. Each of the lower and upper warpage control layers WCL1 and WCL2 may be formed of an insulating material that resists a tensile force or a compressive force. For example, the lower warpage control layer WCL1 may be formed of an insulating material having resistance to the tensile force, and the upper warpage control layer WCL2 may be formed of an insulating material having resistance to the compressive force. In certain embodiments, the lower and upper warpage control layers WCL1 and WCL2 may include the same material but may have different thicknesses. The lower and upper warpage control layers WCL1 and WCL2 may include, for example, silicon oxide or silicon nitride.

Figure 14:
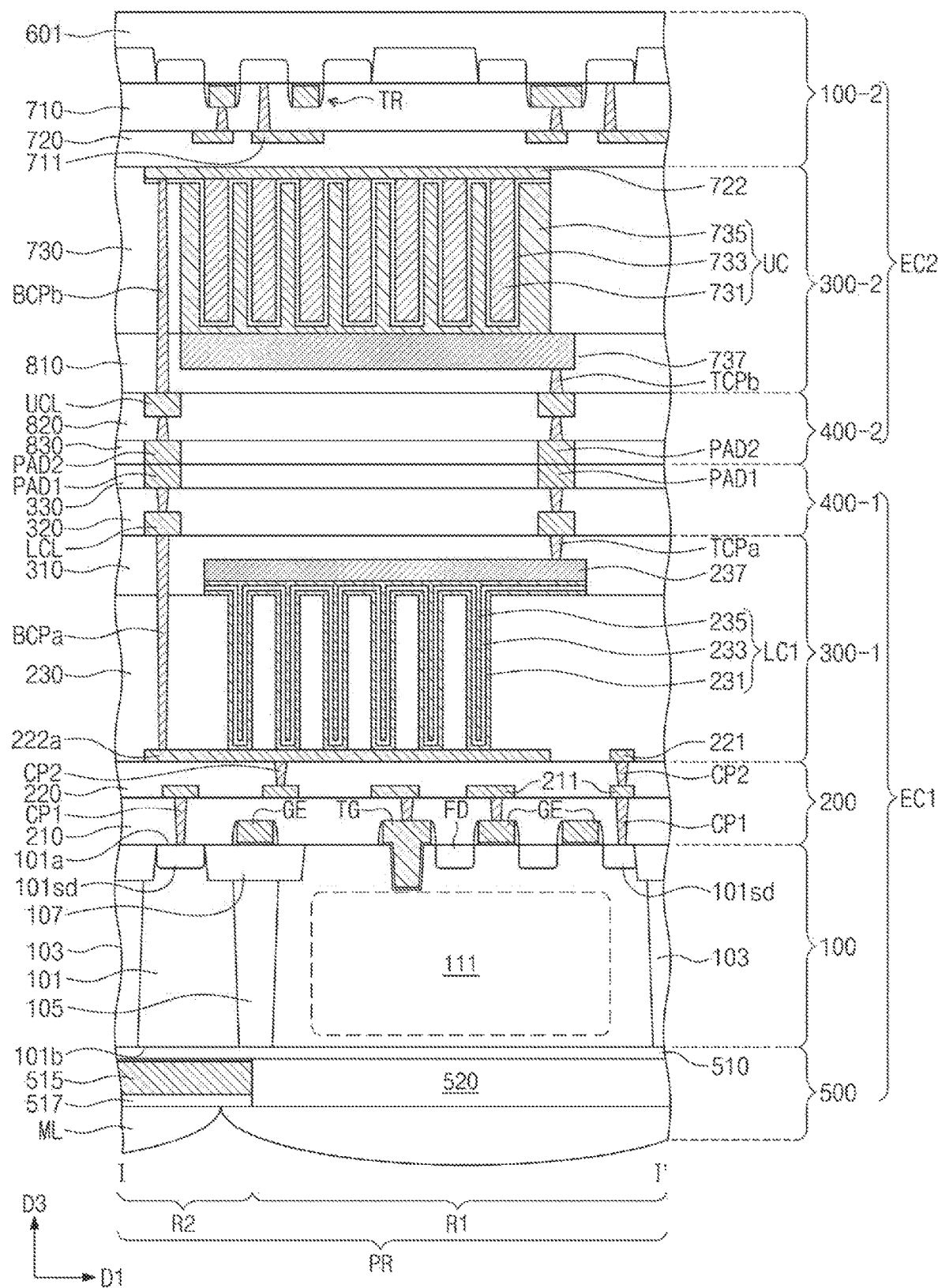

Referring to FIG. 14, shapes of lower storage electrodes 231 of the lower capacitor structure LC may be different from shapes of upper storage electrodes 731 of the upper capacitor structure UC. For example, the lower storage electrodes 231 may have cylindrical shapes, and the upper storage electrodes 731 may have pillar shapes, or vice versa.

Figure 15:
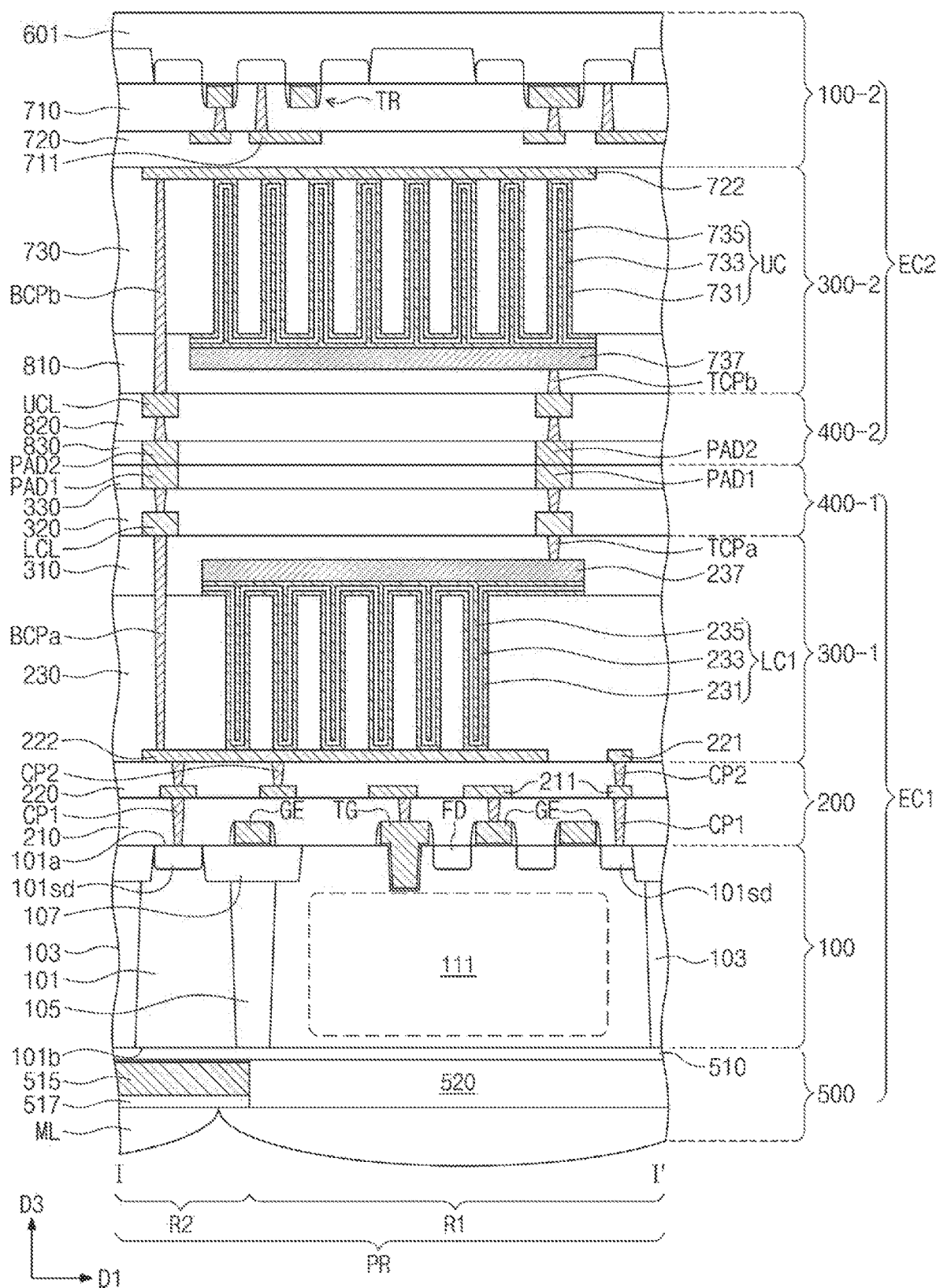

Referring to FIG. 15, the number of lower storage electrodes 231 of the lower capacitor structure LC may be different from the number of upper storage electrodes 731 of the upper capacitor structure UC. Thus, a capacitance of the lower capacitor structure LC may be different from a capacitance of the upper capacitor structure UC.

Figure 16:
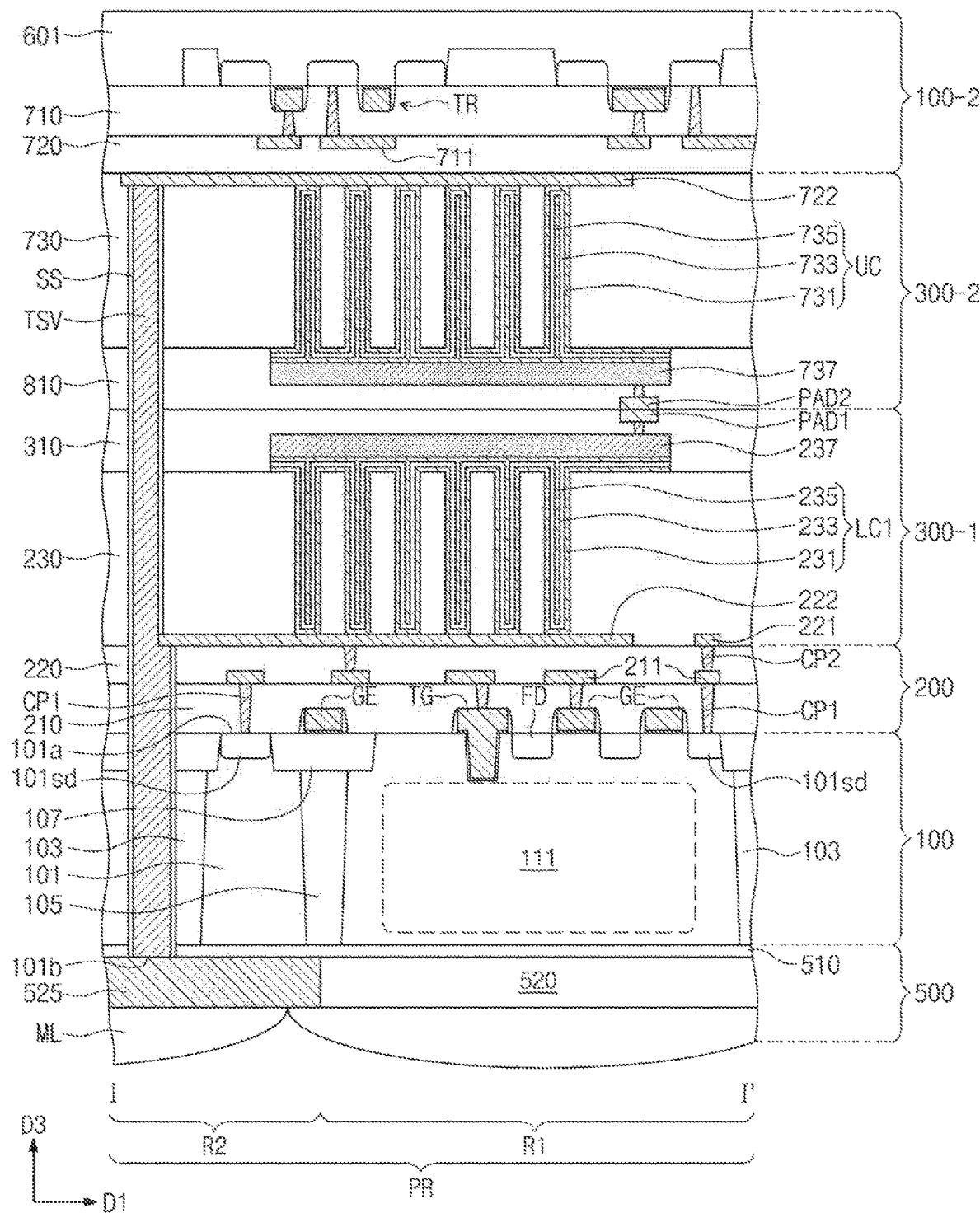

Referring to FIG. 16, the first pad electrode 222 of the lower electronic device EC1 may be electrically connected to the third pad electrode 722 of the upper electronic device UC through a through-conductive plug TSV. For example, the through-conductive plug TSV may vertically extend from the second surface 101b of a lower semiconductor substrate 101 to the third pad electrode 722 of the upper electronic device EC2. The through-conductive plug TSV may penetrate the lower semiconductor substrate 101, the first mold layer 230 and the second mold layer 730 and may be in direct contact with the first pad electrode 222 and the third pad electrode 722. In other words, the through-conductive plug TSV may be electrically connected in common to the first and third pad electrodes 222 and 722. The through-conductive plug TSV may be connected to a conductive pad 525 provided on the second surface 101b of the lower semiconductor substrate 101.

Figure 17:
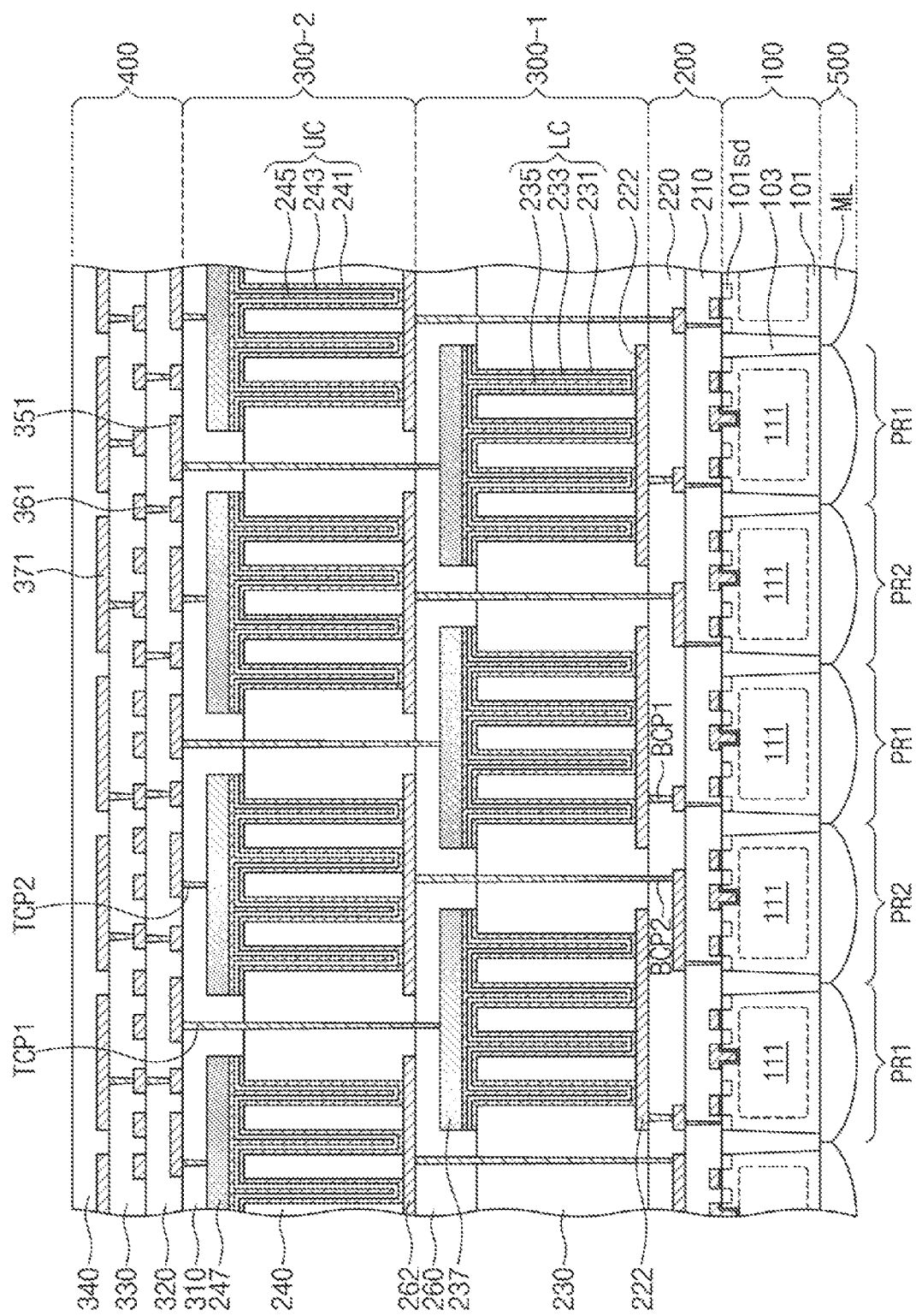
Figure 18:
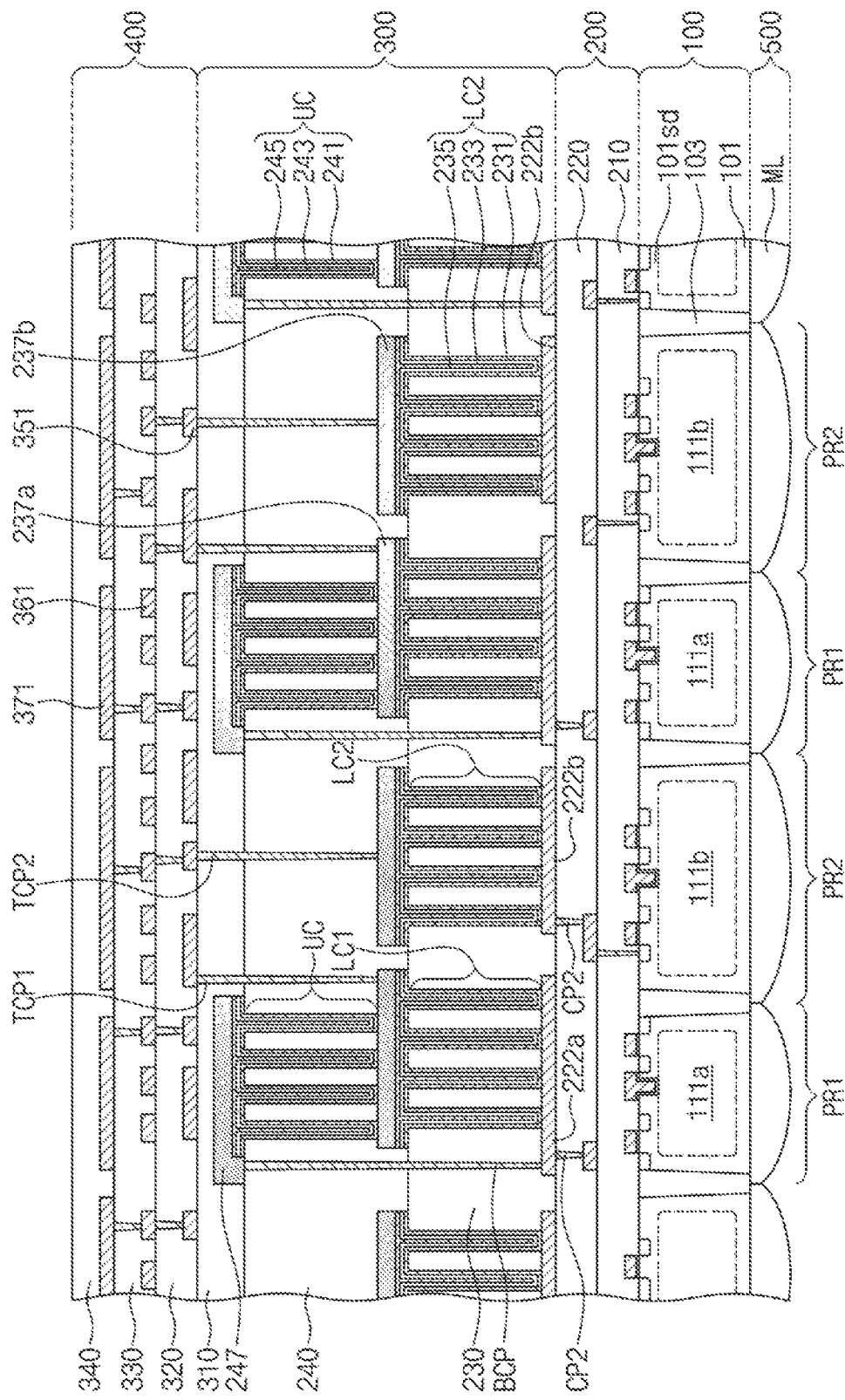

FIGS. 17 and 18 are cross-sectional views illustrating image sensors according to some embodiments.

Referring to FIG. 17, a photoelectric conversion layer 100 may include first and second pixel regions PR1 and PR2 defined by a pixel separation structure 103. The first and second pixel regions PR1 and PR2 may be alternately arranged in one direction. Each of the first and second pixel regions PR1 and PR2 may have substantially the same structure as the pixel region PR described above with reference to FIGS. 5, 6A and 6B.

First and second charge storage layers 300-1 and 300-2 may be sequentially stacked on the integrated circuit layer 200. An intermediate insulating layer 260 may be provided between the first and second charge storage layers 300-1 and 300-2.

The first charge storage layer 300-1 may include first pad electrodes 222, second pad electrodes 237, and lower capacitor structures LC disposed between the first pad electrodes 222 and the second pad electrodes 237, respectively. In some embodiments, each of the first and second pad electrodes 222 and 237 may be disposed on the first and second pixel regions PR1 and PR2. In other words, each of the first and second pad electrodes 222 and 237 may overlap with portions of the photoelectric conversion regions 111 of the first and second pixel regions PR1 and PR2. Each of the lower capacitor structures LC may include lower storage electrodes 231, a lower dielectric layer pattern 233, and a lower plate electrode 235. The lower capacitor structures LC may be electrically connected to transistors of the first pixel regions PR1. For example, the first pad electrodes 222 may be electrically connected to the transistors of the first pixel regions PR1 through first lower contact plugs BCP1.

The second charge storage layer 300-2 may include third pad electrodes 262, fourth pad electrodes 247, and upper capacitor structures UC disposed between the third pad electrodes 262 and the fourth pad electrodes 247, respectively. Each of the upper capacitor structures UC may partially overlap with the lower capacitor structures LC adjacent thereto. Each of the upper capacitor structures UC may include upper storage electrodes 241, an upper dielectric layer pattern 243, and an upper plate electrode 245. The upper capacitor structures UC may be electrically connected to transistors of the second pixel regions PR2. For example, the third pad electrodes 262 may be electrically connected to the transistors of the second pixel regions PR2 through second lower contact plugs BCP2. For example, each of the second lower contact plugs BCP2 may penetrate the lower mold insulating layer 230 between the lower capacitor structures LC adjacent to each other.

An interconnection layer 400 may be provided on the second charge storage layer 300-2. The interconnection layer 400 may include interlayer insulating layers 310 to 340 vertically stacked on the upper mold insulating layer 240, and interconnection lines 351, 361 and 371 between the interlayer insulating layers 310 to 340.

First upper contact plugs TCP1 may penetrate the interlayer insulating layer 310 and the upper mold insulating layer 240 so as to be connected to the second pad electrodes 237, respectively. Each of the first upper contact plugs TCP1 may penetrate the upper mold insulating layer 240 between two adjacent ones of the upper capacitor structures UC. Second upper contact plugs TCP2 may penetrate the interlayer insulating layer 310 so as to be connected to the fourth pad electrodes 247, respectively.

In the embodiment shown in FIG. 17, the first and second charge storage layers 300-1 and 300-2 are stacked. However, embodiments are not limited thereto. In certain embodiments, three or more charge storage layers may be sequentially stacked on the integrated circuit layer 200, like the first and second charge storage layers 300-1 and 300-2.

Referring to FIG. 18, a photoelectric conversion layer 100 may include first and second pixel regions PR1 and PR2 defined by a pixel separation structure 103. The first and second pixel regions PR1 and PR2 may be alternately arranged in one direction. Each of the first and second pixel regions PR1 and PR2 may have substantially the same structure as the pixel region PR described with reference to FIGS. 5, 6A and 6B. However, an area of the first pixel region PR1 may be different from an area of the second pixel region PR2. For example, a width of the first pixel region PR1 in one direction may be less than a width of the second pixel region PR2 in the one direction while heights of the first and second pixel regions PR1 and PR2 are the same. Alternatively, in some embodiments, a height of the first pixel region PR1 in one direction may be less than a height of the second pixel region PR2, while the widths of the first and second pixel regions PR1 and PR2 are the same. In some embodiments, each of the first pixel regions PR1 may correspond to a high-illumination pixel, and each of the second pixel regions PR2 may correspond to a low-illumination pixel. A first photoelectric conversion region 111a may be provided in the semiconductor substrate 101 of each of the first pixel regions PR1, and a second photoelectric conversion region 111b may be provided in the semiconductor substrate 101 of each of the second pixel regions PR2. Here, an area of the first photoelectric conversion region 111a may be less than an area of the second photoelectric conversion region 111b.

An integrated circuit layer 200 may be disposed on the first surface 101a of the semiconductor substrate 101. The integrated circuit layer 200 may include first and second interlayer insulating layers 210 and 220, the transistors described with reference to FIG. 3A, first contact plugs CP1, first interconnection lines 211, and second contact plugs CP2. The first contact plugs CP1, the first interconnection lines 211 and the second contact plugs CP2 may be electrically connected to the transistors.

A charge storage layer 300 may include first pixel charge storage parts corresponding to the first pixel regions PR1, respectively, and second pixel charge storage parts corresponding to the second pixel regions PR2, respectively. Here, a charge storage capacity of the first pixel charge storage part may be greater than a charge storage capacity of the second pixel charge storage part.

Each of the first pixel charge storage parts may include a first lower capacitor structure LC1 between a first lower pad electrode 222a and an intermediate pad electrode 237a, and an upper capacitor structure UC between the intermediate pad electrode 237a and a first upper pad electrode 247. Here, the first lower capacitor structure LC1 and the upper capacitor structure UC may be electrically connected in parallel to each other. The first lower capacitor structure LC1 may be provided in a lower mold insulating layer 230 and may include first lower storage electrodes, a first lower dielectric layer pattern, and a first lower plate electrode. The upper capacitor structure UC may be provided in an upper mold insulating layer 240 and may include upper storage electrodes 241, an upper dielectric layer pattern 243, and an upper plate electrode 245. Here, the first lower pad electrode 222a and the first upper pad electrode 247 may be electrically connected to each other through a lower contact plug BCP. The first lower pad electrode 222a may be electrically connected to the transistor of the first pixel region PR1 through the second contact plug CP2. The intermediate pad electrode 237a may be electrically connected to at least one interconnection line of the interconnection layer 400 through a first upper contact plug TCP1.

Each of the second pixel charge storage parts may include a second lower capacitor structure LC2 between a second lower pad electrode 222b and a second upper pad electrode 237b. The second lower capacitor structure LC2 may include second lower storage electrodes 231, a second lower dielectric layer pattern 233, and a second lower plate electrode 235. The second lower pad electrode 222b may be electrically connected to the transistor of the second pixel region PR2 through the second contact plug CP2. The second upper pad electrode 237b may be electrically connected to at least one interconnection line of the interconnection layer 400 through a second upper contact plug TCP2.

According to the embodiments, each of the first and second capacitors provided in each of the pixel regions may include the lower and upper capacitor structures which may be vertically stacked and be connected in parallel to each other. Thus, the capacitances of the first and second capacitors may be increased. As a result, in a global shutter operation, loss of charges and occurrence of noise may be reduced and shutter efficiency may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
a photoelectric conversion layer including a pixel separation structure defining a plurality of pixel regions, each pixel region including a photoelectric conversion region;
an integrated circuit layer disposed on the photoelectric conversion layer and comprising readout circuits to read charges from the photoelectric conversion region of the plurality of pixel regions;
a charge storage layer disposed on the integrated circuit layer and comprising a stacked capacitor for each of the plurality of pixel regions, the stacked capacitor comprising:
a first lower pad electrode;
an intermediate pad electrode;
a first upper pad electrode;
a contact plug connecting the first upper pad electrode to the first lower pad electrode;
a first lower capacitor structure connected between the first lower pad electrode and the intermediate pad electrode and comprising a plurality of first lower storage electrodes for storing the charges read from the photoelectric conversion region of the pixel region; and
an upper capacitor structure connected between the intermediate pad electrode and the first upper pad electrode and comprising a plurality of upper storage electrodes for storing the charges read from the photoelectric conversion region of the pixel region, the upper capacitor structure being stacked on the first lower capacitor structure to partially overlap the first lower capacitor structure when viewed in plan view.

2. The image sensor of claim 1, wherein the first lower capacitor structure has a first storage capacity, and
the upper capacitor structure has a second storage capacity different than the first storage capacity.

3. The image sensor of claim 1, wherein the first lower capacitor structure has
a first storage capacity, and
the upper capacitor structure has a second storage capacity the same as the first storage capacity.

4. The image sensor of claim 1, wherein the plurality of first lower storage electrodes and the plurality of upper storage electrodes have pillar shapes.

5. The image sensor of claim 1, further comprising:
an insulating layer disposed on a surface of the intermediate pad electrode facing the first upper pad electrode,
wherein the upper capacitor structure comprises an upper mold insulating layer, and the plurality of upper storage electrodes are disposed in the upper mold insulating layer, and
the insulating layer is an etch stop layer having an etch selectivity with respect to the upper mold insulating layer.

6. The image sensor of claim 5, wherein the upper capacitor structure penetrates the etch stop layer to be connected to the intermediate pad electrode.

7. The image sensor of claim 6, wherein lower portions of the plurality of upper storage electrodes are located in the intermediate pad electrode, such that bottom surfaces of the plurality of upper storage electrodes are lower than a top surface of the intermediate pad electrode.

8. The image sensor of claim 1, wherein the plurality of pixel regions are first pixel regions, and the stacked capacitor is provided for each of the first pixel regions, and
wherein the pixel separation structure further defines a plurality of second pixel regions alternatively arranged with the first pixel regions in a first direction, each second pixel region including a photoelectric conversion region, and
wherein the charge storage layer comprises a capacitor for each of the plurality of second pixel regions, the capacitor comprising:
a second lower pad electrode;
a second upper pad electrode; and
a second lower capacitor structure connected between the second lower pad electrode and the second upper pad electrode and comprising a plurality of second lower storage electrodes for storing the charges read from the photoelectric conversion region of the second pixel region.

9. The image sensor of claim 8, wherein an area of the photoelectric conversion region of each of the plurality of second pixel regions is greater than an area of the photoelectric conversion region of each of the first pixel regions.

10. The image sensor of claim 1, further comprising:
an upper layer comprising a first substrate, the photoelectric conversion layer formed in the first substrate and the integrated circuit layer and the charge storage layer formed on the first substrate; and
a lower layer comprising a second substrate including a plurality of logic circuits formed on the second substrate,
wherein the upper layer is bonded to the lower layer.

11. The image sensor of claim 1, further comprising:
a lower layer comprising a first substrate, the photoelectric conversion layer formed in the first substrate and the integrated circuit layer and the charge storage layer formed on the first substrate; and
an upper layer comprising a second substrate including a plurality of logic circuits formed on the second substrate,
wherein the upper layer is bonded to the lower layer.

12. An image sensor comprising:
a photoelectric conversion layer having a pixel separation structure defining a photoelectric conversion region;
an integrated circuit layer disposed on the photoelectric conversion layer and comprising readout circuits to read charges from the photoelectric conversion region;

a first charge storage layer comprising a first capacitor structure comprising a plurality of first storage electrodes for storing the charges read from the photoelectric conversion region;

a first warpage control layer;

a second charge storage layer bonded to the first charge storage layer, the second charge storage layer comprising a second capacitor structure comprising a plurality of second storage electrodes for storing the charges read from the photoelectric conversion region, the second capacitor structure being stacked on the first capacitor structure to partially overlap the first capacitor structure when viewed in plan view; and a second warpage control layer formed on a surface of the second charge storage layer facing the first charge storage layer.

13. The image sensor of claim 12, wherein the first capacitor structure has a first storage capacity, and the second capacitor structure has a second storage capacity different than the first storage capacity.

14. The image sensor of claim 12, wherein the first capacitor structure has a first storage capacity, and the second capacitor structure has a second storage capacity the same as the first storage capacity.

15. The image sensor of claim 12, wherein the first warpage control layer is formed of an insulating material that resists one of a tensile force or a compressive force, and the second warpage control layer is formed of an insulating material that resists the other of the tensile force or the compressive force.

16. The image sensor of claim 12, wherein the second charge storage layer is bonded to the first charge storage layer by copper to copper bonding.

17. The image sensor of claim 16, wherein the first capacitor structure comprises:

the plurality of first storage electrodes connected to a first pad electrode;

a first dielectric layer pattern covering the plurality of first storage electrodes; and a first plate electrode connected to a second pad electrode, portions of the first plate electrode extending, respectively, between adjacent ones of the plurality of first storage electrodes, and wherein the second capacitor structure comprises:

the plurality of second storage electrodes connected to a third pad electrode;

a second dielectric layer pattern covering the plurality of second storage electrodes; and a second plate electrode connected to a fourth pad electrode, portions of the second plate electrode extending, respectively, between adjacent ones of the plurality of second storage electrodes, wherein the second pad electrode is electrically connected to the fourth pad electrode via first and second connection pads, and wherein the image sensor further comprises a through conductive plug connected to the first pad electrode, the third pad electrode and a conductive pad disposed in a light transmitting layer.

\* \* \* \* \*